(12) United States Patent
Okuda et al.

(10) Patent No.: US 9,294,115 B2
(45) Date of Patent: *Mar. 22, 2016

(54) PASSIVE AMPLIFICATION CIRCUIT AND ANALOG-DIGITAL CONVERTOR

(71) Applicant: RENESAS ELECTRONICS CORPORATION, Kanagawa (JP)

(72) Inventors: Yuichi Okuda, Kanagawa (JP); Hideo Nakane, Kanagawa (JP); Takaya Yamamoto, Kanagawa (JP); Keisuke Kimura, Kanagawa (JP); Takashi Oshima, Tokyo (JP); Tatsuji Matsuura, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/692,374

(22) Filed: Apr. 21, 2015

(65) Prior Publication Data

US 2015/0229322 A1   Aug. 13, 2015

Related U.S. Application Data

(63) Continuation of application No. 14/159,511, filed on Jan. 21, 2014, now Pat. No. 9,054,726.

(30) Foreign Application Priority Data

Jan. 23, 2013  (JP) .................................. 2013-010218
Dec. 17, 2013  (JP) .................................. 2013-259954

(51) Int. Cl.
H03M 1/38    (2006.01)
H03F 3/45    (2006.01)
(Continued)

(52) U.S. Cl.
CPC ................. *H03M 1/38* (2013.01); *G11C 27/02* (2013.01); *H03F 3/45071* (2013.01);
(Continued)

(58) Field of Classification Search
CPC ..... H03M 1/124; H03M 1/1245; H03M 1/38; H03M 1/44; G11C 27/02; H03H 7/004
See application file for complete search history.

(56) References Cited

U.S. PATENT DOCUMENTS 5,180,932 A  1/1993  Bengel
6,985,024 B2  1/2006  Geen
(Continued)

FOREIGN PATENT DOCUMENTS

JP  60-051901 A  3/1985
JP  2000-269792 A  9/2000

OTHER PUBLICATIONS

Ahmed et al., "A 50MS/s 9.9mW Pipelined ADC with 58dB SNDR in 0.18 μm CMOS Using Capacitive Charge-Pumps", ISSCC Dig. Tech. Papers, 2009, pp. 164-165.
(Continued)

Primary Examiner — Howard Williams
(74) Attorney, Agent, or Firm — Mattingly & Malur, PC

(57) ABSTRACT

A differential signal is amplified by passive amplification which does not a reference of a common-mode voltage. At this time, the voltage of the differential signal is passive-amplified twice before carrying out a successive approximation type analog-digital conversion operation. The passive amplification is attained by providing a plurality of capacitances which carry out a sampling operation, and switching these connection relation by using switches. Without being accompanied by the increase of the consumed power and the chip size, an influence by the noise of s comparator is reduced to a half so that the effective resolution can be increased for one bit.

12 Claims, 29 Drawing Sheets

(51) Int. Cl.
*G11C 27/02* (2006.01)
*H03M 1/44* (2006.01)
*H03M 1/12* (2006.01)
*H03H 7/00* (2006.01)
*H03M 1/00* (2006.01)

(52) U.S. Cl.
CPC .......... *H03F 3/45475* (2013.01); *H03H 7/004* (2013.01); *H03M 1/002* (2013.01); *H03M 1/124* (2013.01); *H03F 2203/45171* (2013.01); *H03F 2203/45544* (2013.01); *H03M 1/44* (2013.01)

(56) References Cited

U.S. PATENT DOCUMENTS

| | | | |
|---|---|---|---|
| 2006/0244513 A1* | 11/2006 | Yen | H02M 3/07 327/536 |
| 2010/0237710 A1 | 9/2010 | Fagg et al. | |
| 2011/0248875 A1 | 10/2011 | Holcombe | |
| 2014/0070976 A1 | 3/2014 | Hurrell et al. | |

OTHER PUBLICATIONS

Craninckx et al., "A 65fJ/Conversion-Step 0-to-50MS/s 0-to-0.7mW 9b Charge-Sharing SAR ADC in 90nm Digital CMOS," International Solid-State Circuits Conference, Digest of Technical Papers, Feb. 2007, pp. 246-247.

Liu et al., "A 12b 22.5/45MS/s 3.0mW 0.059mm2 CMOS SAR ADC achieving over 90dB SFDR", International Solid-State Circuits Conference, Digest of Technical Papers, Feb. 2010, pp. 380-381.

Hurrell et al., "An 18b 12.5MHz ADC with 93dB SNR", International Solid-State Circuits Conference, Digest of Technical Papers, Feb. 2010, pp. 378-379.

Shu et al., "A 65nm CMOS CTΔΣ modulator with 81 dB DR and 8MHz BW auto-tuned by pulse injection", International Solid-State Circuits Conference, Digest of Technical Papers, Feb. 2008, pp. 500-501.

Ahmed et al.; "A Low-Power Capacitive Charge Pump Based Pipelined ADC"; IEEE Journal of Solid-State Circuits; vol. 45, No. 5; May 2010; pp. 1016-1027.

* cited by examiner

F I G. 5 A
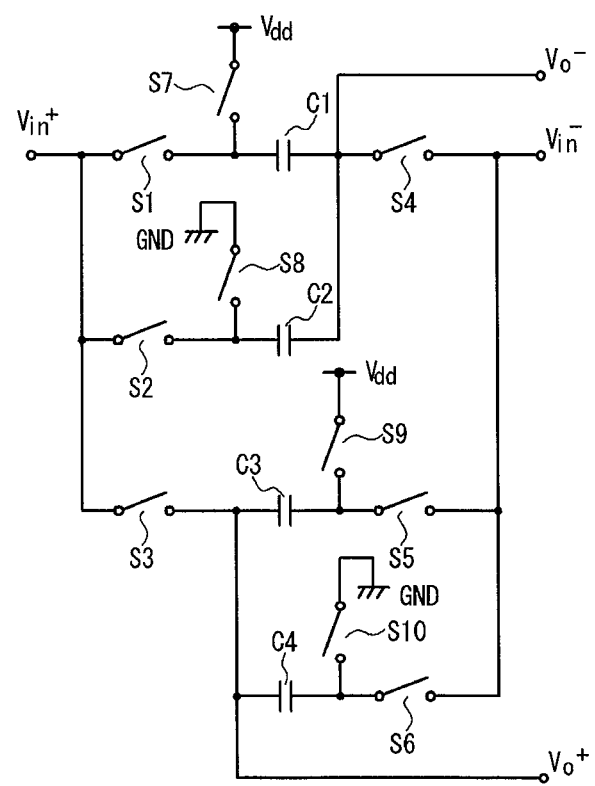

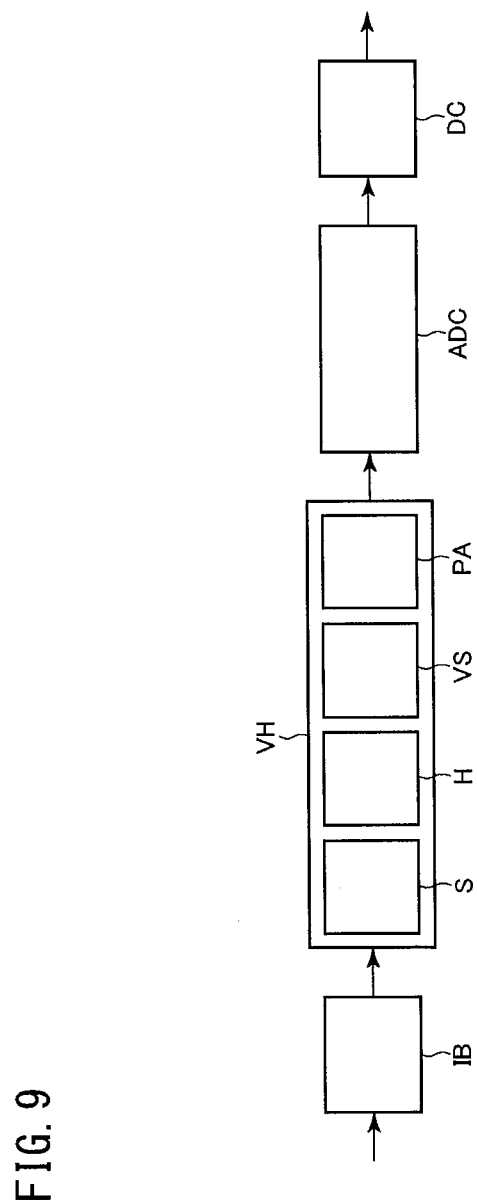

PASSIVE AMPLIFICATION CIRCUIT AND ANALOG-DIGITAL CONVERTOR

CROSS REFERENCE

This application is a continuation of U.S. patent application Ser. No. 14/159,511, filed Jan. 1, 2014, which claims priorities on convention based on Japanese Patent Application Nos. JP 2013-010218 and JP 2013-259954. The disclosure thereof is incorporated herein by reference.

TECHNICAL FIELD

The present invention is related to a passive amplification circuit and an analog-digital convertor, and more particularly, to a passive amplification circuit having the voltage gain of 1 to 2 times, and an analog-digital convertor suitable for a charge share type successive approximation type analog-digital convertor.

BACKGROUND ART

Conventionally, a configuration is generally used in which correct signal amplification is carried out by using a closed amplifier for a circuit which contains an amplification stage thereinside, such as a pipeline ADC (Analog-Digital Converter).

However, although the closed amplifier can realize amplification in a high precision, it causes the increase of the consumed power in a high-speed operation. As a result, it is tended to increase the the consumed power of the ADC. Therefore, the approach is proposed in which the consumed power is suppressed by employing an open loop amplifier, a dynamic amplifier such as a comparator, and a passive amplifier by a passive device.

However, while these schemes can realize the high-speed operation and the low consumed power operation, it is difficult to realize linearity and a gain in a high precision independently. Thus, a usage method in which a calibration technique is combined is adopted.

Not only an inter-stage amplifier of the pipeline ADC but also an ADC which carries out a sampling operation are effective for these schemes in which signal amplification is carried out without the closed amplifier. If an amplification stage is provided after the sampling stage, an input conversion noise after sampling stage can be reduced and the noise request can be eased.

A technique which relates to the above technique is reported in Non-Patent Literature 1 and Patent Literature 1. In Non-Patent Literature 1, a method of simply realizing signal amplification by using a capacitance is described. In Patent Literature 1, a method of carrying out the amplification of only a differential signal by using a common mode reference voltage is proposed.

Also, a next generation mobile phone terminal requires that it is possible to handle various methods of LTE (Long Term Evolution) and LTE Advanced in addition to a conventional GSM (Global System for Mobile communication) method and the WCDMA (Wideband Code Division Multiple Access) method. For a signal received in each of these methods of one analog-digital convertor, the conversion rate as high-speed as about 40 MS/s (mega sample per second) and the high effective resolution of 11 bits or more are required.

Also, in the mobile terminal, a very small consumed power of the analog-digital convertor is required. Due to the miniaturization of the semiconductor manufacture process, an error factor of an analog circuit of the analog-digital convertor is corrected with a digital circuit, to improve the effective resolution. As the analog-digital convertor with low consumed power, an analog-digital convertor of a successive approximation type is suitable to carry out a digital correction. Moreover, as the analog-digital convertor of the successive approximation type which carries out a high-speed operation, the analog-digital convertor with a charge share-type successive approximation type according to the following Non-Patent Literature 2 more than the analog-digital convertor of a charge share type successive approximation type's being suits.

In the microcomputer of the next generation, as the multi-function develops, the analog-digital convertor of the high speed and high resolution is required. As the analog-digital convertor mounted on a microcomputer, the effective resolution of 11 bits or more is often required.

Also, in case of the microcomputer, especially, it is required that chip size of the analog-digital convertor is small. Therefore, the analog-digital convertor of the successive approximation type which carries out the digital correction is more suitable than the analog-digital convertor of a pipeline type which carries out the digital correction. Moreover, because the high-speed operation of tens of MS/s or higher is required in many cases, the analog-digital convertor of a charge share-type successive approximation type is suitable.

The analog-digital convertor of the charge share-type and successive approximation type which carries out a digital correction has one feature that a high resolution can be realized in the small chip size and consumed power in the conversion rate of about 100 MS/s or below. Therefore, the wide application such as SoC (System on a Chip) technique is thought of in addition to the above convertor.

A comparator for the analog-digital convertor is disclosed in Patent Literatures 2 and 3.

Non-Patent Literature 3 discloses an approach which improves an effective resolution, by setting an input full scale range to Rail-to-Rail, in the analog-digital convertor of the charge redistribution-type and the successive approximation type which carries out the digital correction. That is, by using from the power supply voltage VDD to the grounding voltage completely, a signal component is maximized in SNR (Signal to Noise Ratio).

Also, many conventional analog-digital convertor of the successive approximation type disclose the approaches which improve an effective resolution by fundamentally reducing a quantity of noise generated by a comparator known as a dominant noise source of the analog-digital convertor. The noise voltage level of the comparator is inversely proportion to a square root of the capacitance. Therefore, by increasing a capacitance value to 4 times, the noise can be reduced to a half. When the capacitance is increased to 4 times, it needs to maintain a conversion rate by increasing the consumed power of the comparator to 4 times to maintain a response speed.

Non-Patent Literature 4 discloses an analog-digital convertor of a charge redistribution-type and a successive approximation type which carries out the determination of each of bits in a first half from the MSB (Most Significant Bit). Next, a conversion residual after the conversion of the first half is amplified by an intermediate amplifier and the analog-digital conversion is carried out to the amplified residual. Thus, each of bits of the second half to the LSB (Least Significant Bit) is determined. In this way, because the noise level which is required for the comparator can be eased for the gain of the above-mentioned intermediate amplifier, the influence by the noise of the comparator can be substantively made small.

Non-Patent Literature 5 discloses a sigma-delta analog-digital convertor which is known to be possible to output a high resolution.

CITATION LIST

[Patent Literature 1] US 2010/0237710A1
[Patent Literature 2] JP S60-51901A
[Patent Literature 3] JP 2000-269792A
[Non-Patent Literature 1] I. Ahmed et al., "A 50 MS/s 9.9 mW Pipelined ADC with 58 dB SNDR in 0.18 μm CMOS Using Capacitive Charge-Pumps", ISSCC Dig. Tech. Papers, pp. 164-165, 2009.
[Non-Patent Literature 2] Jan Craninckx and Geert Van der Plas, "A 65 fJ/Conversion-Step 0-to-50 MS/s 0-to-0.7 mW 9b Charge-Sharing SAR ADC in90 nm Digital CMOS," International Solid-State Circuits Conference, Digest of Technical Papers, pp. 246-247, February 2007.
[Non-Patent Literature 3] Wenbo Liu, Pingli Huang and Yun Chiu, "A 12b 22.5/45 MS/s 3.0 mW 0.059 mm2 CMOS SAR ADC achieving over 90 dB SFDR", International Solid-State Circuits Conference, Digest of Technical Papers, pp. 380-381, February 2010.
[Non-Patent Literature 4] Christopher Peter Hurrell, Colin Lynden, David Laing, Derek Hummerston and Mark Vickery, "An 18b 12.5 MHz ADC with 93 dB SNR", International Solid-State Circuits Conference, Digest of Technical Papers, pp. 378-379, February 2012.
[Non-patent literature 5] Yun-Shiang Shu, Bang-Sup Song and Kantilal Bacrania, "A 65 nm CMOS CTΔΣ modulator with 81 dB DR and 8 MHz BW auto-tuned by pulse injection", International Solid-State Circuits Conference, Digest of Technical Papers, pp. 500-501, February 2008.

SUMMARY OF THE INVENTION

When a differential signal is amplified by a passive amplifier, only the differential signal is amplified without needing a reference of a common-mode voltage. Also, an error efficient of an analog circuit which is a cause to degrade the effective resolution of the analog-digital converter, contains a non-linear error, a DC offset, a comparator noise and so on. It is possible to improve the effective resolution by carrying out the digital correction for the non-linear error and the DC offset. However, because the comparator noise is a random noise, it is difficult to carry out a systematic correction such as the digital correction. One object of the present invention is to improve the effective resolution of the analog-digital convertor which carries out the digital correction. Other objects and a new feature would become clear from the description of this Specification and the attached drawings.

According to an embodiment, a differential signal is passive-amplified by a passive amplifier which does not use a reference of a common-mode voltage, and before carrying out an analog-digital conversion operation, the voltage of the differential signal is passive-amplified to twice.

According to the embodiment, it becomes possible to avoid a high-speed charging and discharging operation because the reference of the common-mode voltage is not used for the passive amplifier. Also, without being accompanied by the increase of the consumed power and the chip size, an influence of the noise of the comparator can be reduced to a half so that the effective resolution can be increased for one bit.

BRIEF DESCRIPTION OF THE DRAWINGS

FIG. 5A is a diagram schematically showing the configuration example of the passive amplification circuit in a second embodiment;

FIG. 9 is a functional block diagram showing the configuration of the analog-digital convertor in a fourth embodiment;

DESCRIPTION OF EMBODIMENTS

Hereinafter, embodiments will be described.

At first, problems in a the conventional passive amplification circuit will be described as the conventional examples 1 to 3 in order to facilitate the understanding of technical meaning.

Conventional Example 1

In Non-Patent Literature 1, a method of simply realizing signal amplification by using a capacitance has been described. In this method, capacitances connected in parallel are stacked in serial upon sampling a signal so as to obtain a voltage with the magnitude of about twice.

Figure 1A:
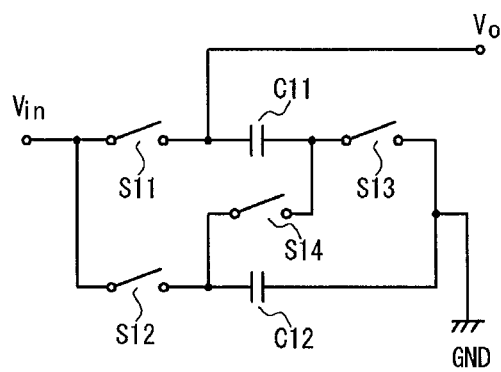
FIG. 1A is a diagram schematically showing a configuration example of a passive amplification circuit according to a conventional example 1.

FIG. 1A is a diagram schematically showing a configuration example of the passive amplification circuit according to the conventional example 1.

The components of the passive amplification circuit shown in FIG. 1A will be described. The passive amplification circuit shown in FIG. 1A has a first capacitance C11, a second capacitance C12, an input terminal $V_{in}$, an output terminal Vo, the ground voltage GND, and a first switch S11 to a fourth switch S14. Here, the first capacitance C1 and the second capacitance C2 have a same capacitive amount or capacitance.

The connection relation of the respective components shown in FIG. 1A will be described. The input terminal Vin is connected in common with one of the ends of a first switch S11 and one of the ends of the second switch S12. The output terminal Vo is connected in common with the other end of the first switch S11 and one of the ends of the first capacitance C11. The other end of the second switch S12 is connected in common with one of the ends of the second capacitance C12 and one of the ends of the fourth switch S14. The other end of the first capacitance C11 is connected in common with one of the ends of the third switch S13 and the other end of the fourth switch S14. The ground voltage GND is connected in common with the other end with the second capacitance C12 and the other end of third switch S13.

An operation of the passive amplification circuit shown in FIG. 1A will be described. The first switch S11 to the third switch S13 are controlled simultaneously as a first switch group to switch between a block-off (isolation) state and a conductive state. The fourth switch S14 is controlled as a second switch group independently from the first switch group, to switch the block-off state and the conductive state.

The control of the first switch group and the second switch group is carried out in response to a first control signal and a second control signal which are generated by a control circuit (not shown).

Figure 1B:
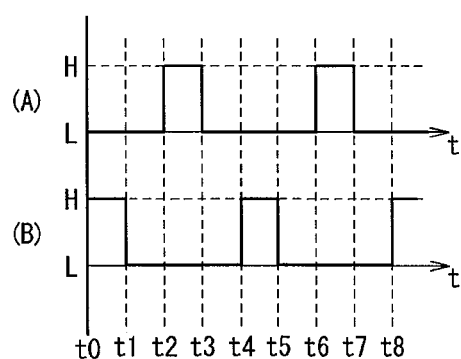
FIG. 1B is a time chart showing an example of a control signal to control each switch group shown in FIG. 1A.

FIG. 1B is a time chart showing an example of the control signal to control each of the switch groups shown in FIG. 1A. FIG. 1B contains a first graph (A) and a second graph (B).

The first graph (A) in FIG. 1B shows an example of the first control signal. The second graph (B) in FIG. 1B shows an example of the second control signal. In each of the first and second graphs (A) and the second graphs (B) shown in FIG. 1B, the horizontal axis shows a time and the vertical axis shows the logic state of the control signal. In this case, when each control signal is in the low state in each graph, the switch is set to the block-off state, and when being in the high state, the switch is set to the conductive state.

In an example of a time chart shown in FIG. 1B, in the time periods t0 to t1, t4 to t5, and t8 and the subsequent, the first switch S11 to the third switch S13 are in the block-off state and the fourth switch S14 is in the conductive state. At this time, in the circuit of FIG. 1A, the first capacitance C11 and the second capacitance C12 are connected between the input terminal Vin and the ground voltage GND in parallel. This state of the passive amplification circuit shown in FIG. 1A is called a parallel connection state.

In the same way, in the time periods of t2 to t3 and t6 to t7, the first capacitance C11 and the second capacitance C12 are connected in serial between the output terminal Vo and the ground voltage GND in this order. This state of the passive amplification circuit shown in FIG. 1A is called a serial connection state.

Besides, in time periods t1 to t2, t3 to t4, t5 to t6 and t7 to t8, all switches are in the block-off state. At this time, in the circuit of FIG. 1A, each of the terminals of the first capacitance C11 and the second capacitance C12 is insulated from all of the input terminals Vin, the output terminals Vo and the ground voltage GND. This state of the passive amplification circuit shown in FIG. 1A is called the block-off state.

The passive amplification circuit shown in FIG. 1A repeats the above-mentioned parallel connection state and the serial connection state through the block-off state. Thus, the sampling operation of a signal supplied from the input terminal Vin is carried out in the parallel connection state, and the voltages are stacked in serial to produce a voltage of approximately twice in the serial connection state outputted from the output terminal Vo.

When amplifying a differential signal by the passive amplification circuit shown in FIG. 1A, it is desired to amplify only a differential component of the differential signal. That is, when the voltage of the differential signal is expressed as $Vcmi \pm Vin$ and an amplification gain is expressed as G, the desired output signal is $Vcmo \pm GVin$.

However, because common mode components of the differential signal is also amplified by the passive amplification circuit shown in FIG. 1A, $GVcmi \pm GVin$ is actually obtained as the output signal. As a result, there is a problem that a level shift circuit is newly necessary, in order to take a consistence with an input range of the rear stage whose output dynamic range is limited.

As an approach to solve these problems, methods of amplifying only a differential signal by using the common mode reference is proposed in Non-Patent Literature 1 and Patent Literature 1. These methods will be described as the conventional example 2 and the conventional example 3.

Conventional Example 2

Figure 2A:
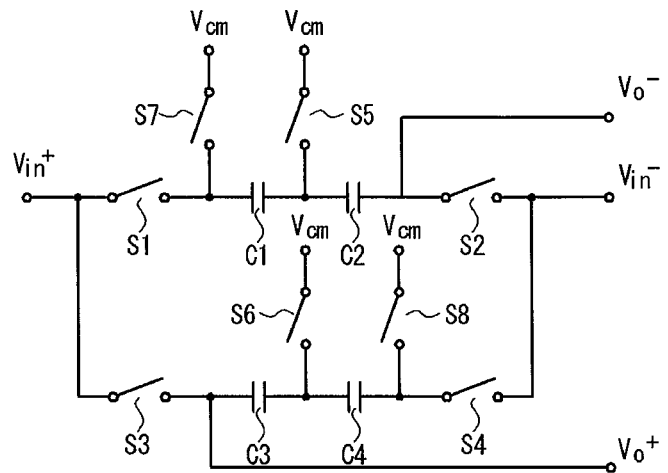
FIG. 2A is a diagram schematically showing a configuration example of the passive amplification circuit according to the conventional example 2.

FIG. 2A is a diagram schematically showing a configuration example of the passive amplification circuit according to the conventional example 2.

The components of the passive amplification circuit shown in FIG. 2A will be described. The passive amplification circuit shown in FIG. 2A has the first capacitance C1 to the fourth capacitance C4, the positive side input terminal of Vin+, the negative side input terminal Vin−, the positive side output terminal Vo+, the negative side output terminal Vo−, a reference voltage supply end Vcm, a first switch S1 to an eighth switch S8. Here, the first capacitance C1 to the fourth capacitance C4 have a same capacitance. The positive side input terminal Vin+ and the negative side input terminal Vin− respectively input a positive side voltage and a negative side voltage of an input signal. The positive side output terminal Vo+ and the negative side output terminal Vo− respectively output a positive side voltage and a negative side voltage of an output signal. The reference voltage supply end Vcm supplies a common mode component of the differential signal as a reference voltage.

The connection relation of the respective components shown in FIG. 2A will be described. The positive side input terminal Vin+ is connected with one of the ends of the first switch S1 and one of the ends of the third switch S3. The positive side output terminal Vo+ is connected in common with the other end of the third switch S3 and one of the ends of the third capacitance C3. The reference voltage supply end Vcm is connected with one of the ends of the fifth switch S5, one of the ends of the sixth switch S6, one of the ends of the seventh switch S7 and one of the ends of the eighth switch S8. One of the ends of the first capacitance C1 is connected in common with the other end of the first switch S1 and the other end of the seventh switch S7. The other end of the first capacitance C1 is connected with the other end of the fifth switch S5 and one of the ends of the second capacitance C2. The negative side output terminal Vo− is connected with the other end of the second capacitance C2 and one of the ends of the second switch S2. The other end of the third capacitance C3 is connected in common with the other end of the sixth switch S6 and one of the ends of the fourth capacitance C4. The other end of the fourth capacitance C4 is connected in common with the other end of the seventh switch S7 and one of the ends of the fourth switch S4. The negative side input terminal Vin− is connected in common with the other end of the second switch S2 and the other end of the fourth switch S4.

An operation of the passive amplification circuit shown in FIG. 2A will be described. The first switch S1 to the sixth switch S6 are controlled as the first switch group to carry out the switching between the block-off state and the conductive state at the same time. The seventh switch S7 to the eighth switch S8 are controlled as the second switch group to carry out the switching between the block-off state and the conductive state at the same time, independently from the first switch group.

The control of the first switch group and the second switch group is carried out in response to the first control signal and the second control signal which are generated by a control circuit (not shown).

Figure 2B:
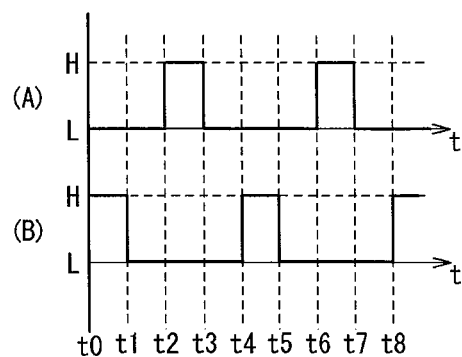
FIG. 2B is a time chart showing an example of the control signal to control each switch group shown in FIG. 2A.

FIG. 2B is a time chart showing an example of the control signals which controls each of the switch groups shown in FIG. 2A. The time chart in FIG. 2B is the same as the time chart shown in FIG. 1B. Also, because the relation between the control signals, the graphs and the above two switch groups shown in FIG. 2B is same as that of FIG. 1B, further detailed description is omitted.

The passive amplification circuit shown in FIG. 2A carries out a sampling operation in each of time periods of t0 to t1, t4 to t5 and t8 and the subsequent. At this time, the first capacitance C1 and the second capacitance C2 are connected in serial between the positive side input terminal Vin+ and the negative side input terminal Vin−, and moreover the reference voltage is applied to a node between the two capacitances. In the same way, the third capacitance C3 and the fourth capacitance C4 are connected in serial between the positive side input terminal Vin+ and the negative side input terminal Vin− and moreover a reference voltage is applied to a node between the two capacitances. Note that at this time, a set of the first capacitance C1 and the second capacitance C2 and a set of the third capacitance C3 and the fourth capacitance C4 are connected in parallel.

The reference voltage is equal to the common mode component of the differential signal $Vcmi \pm Vin$ which is supplied between the positive side input terminal Vin+ and the negative side input terminal Vin−. Therefore, at the time of sampling, only a differential component of the differential signal is applied to the first capacitance C1 to the fourth capacitance C4.

Also, the passive amplification circuit shown in FIG. 2A amplification-operates in the time periods t2 to t3 and t6 to t7. At this time, the first capacitance C1 and the second capacitance C2 are connected in serial between the reference voltage supply end Vcm and the negative side output terminal Vo−. In the same way, the third capacitance C3 and the fourth capacitance C4 are connected in serial between the reference voltage supply end Vcm and the positive side output terminal Vo+. Therefore, a signal in which only a differential component of the differential signal is amplified approximately twice is obtained to the output terminals.

Conventional Example 3

Figure 3A:
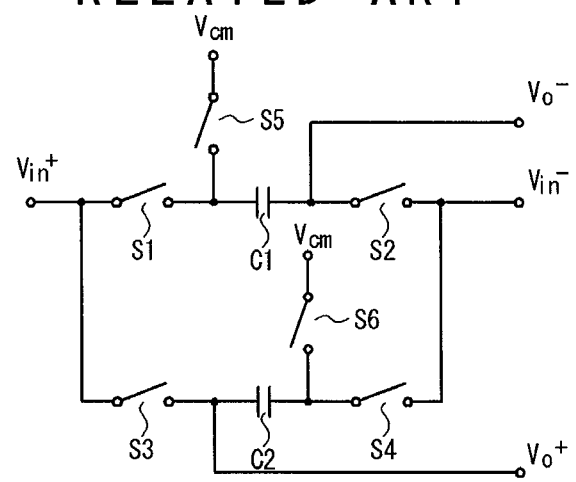
FIG. 3A is a diagram schematically showing a configuration example of the passive amplification circuit according to the conventional example 3.

FIG. 3A is a diagram schematically showing a configuration example of the passive amplification circuit according to the conventional example 3.

The component of the passive amplification circuit shown in FIG. 3A will be described. The passive amplification circuit shown in FIG. 3A has the first capacitance C1, the second capacitance C2, the positive side input terminal Vin+, the negative side input terminal Vin−, the positive side output terminal Vo+, the negative side output terminal Vo−, the reference voltage supply end Vcm, the first switch S1 to the sixth switch S6. Here, the first capacitance C1 and the second capacitance C2 have completely the same capacitance. The positive side input terminal Vin+ and the negative side input terminal Vin− input the positive side voltage and the negative side voltage of the input signal, respectively. The positive side output terminal Vo+ and the negative side output terminal output the positive side voltage and the negative side voltage of the output signal, respectively. The common mode component of the differential signal is supplied to the reference voltage supply end Vcm as the reference voltage.

The connection relation of the respective components shown in FIG. 3A will be described. The positive side input terminal Vin+ is connected in common with one of the ends of the first switch S1 and one of the ends of the third switch S3. The reference voltage supply end Vcm is connected with one of the ends of the fifth switch S5 and one of the ends of the sixth switch S6. One of the ends of the first capacitance C1 is connected in common with the other end of the first switch S1 and the other end of the fifth switch S5. The negative side output terminal is connected in common with the other end of the first capacitance C1 and one of the ends of the second switch S2. The positive side output terminal Vo+ is connected in common with the other end of the third switch S3 and one of the ends of the second capacitance C2. The other end of the second capacitance C2 is connected in common with one of the ends of the fourth switch S4 and the other end of the sixth switch S6. The negative side input terminal Vin− is connected in common with the other end of the second switch S2 and the other end of the fourth switch S4.

An operation of the passive amplification circuit shown in FIG. 3A will be described. The first switch S1 to the fourth switch S4 are controlled as the first switch group to carry out the switching between the block-off state and the conductive state simultaneously. A fifth switch S5 and a sixth switch S6 are controlled as the second switch group to carry out the switching between the block-off state and the conductive state simultaneously and independently from the first switch group.

The control of the first switch group and the second switch group is carried out in response to the first control signal and the second control signal generated by a control circuit (not shown), respectively.

Figure 3B:
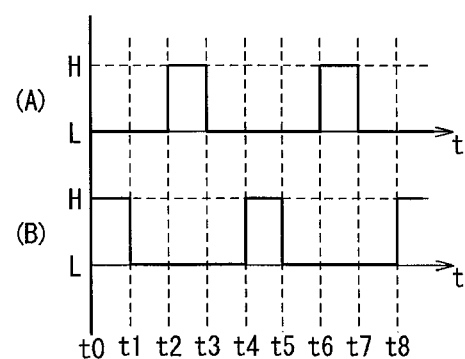
FIG. 3B is a time chart showing an example of the control signal to control each switch group shown in FIG. 2A.

FIG. 3B is a time chart showing an example of the control signal which controls each switch group shown in FIG. 3A. The time chart shown in FIG. 3B is the same as the time chart shown in FIG. 1B. Also, because the relation between the respective graphs shown in FIG. 3B, the two control signal and the two switch groups is same as that of FIG. 1B, further detailed description is omitted.

The passive amplification circuit shown in FIG. 3A carries out the sampling operation in each of the time period t0 to t1, t4 to t5 and t8 and the subsequent. At this time, the first capacitance C1 and the second capacitance C2 are in the parallel connection state between the positive side input terminal Vin+ and the negative side input terminal Vin−.

Also, the passive amplification circuit shown in FIG. 3A carries out an amplification in the time periods t2 to t3 and t6 to t7. At this time, the first capacitance C1 is connected between the reference voltage supply end Vcm and the negative side output terminal Vo−. In the same way, the first capacitance C1 is connected between the positive side output terminal Vo+ and the reference voltage supply end Vcm.

The reference voltage which is applied from the reference voltage supply end Vcm is equal to the common mode component of the differential signal Vcmi±Vin which is supplied between the positive side input terminal Vin+ and the negative side input terminal Vin−. Therefore, in the passive amplification circuit shown in FIG. 3A, in amplification operation, the differential signal is obtained in which only a differential component is amplified by subtracting the reference voltage which is equivalent to the common mode component before the amplification from the differential signal amplified approximately twice.

Comparing with the case of the conventional example 2, there is a merit that can reduce a total capacitance area can be reduced in the passive amplification circuit according to the conventional example 3. Also, comparing KT/C noise (thermal noise) per signal under a predetermined state, because a required capacitance in the conventional example 3 is only ¼ of that of the conventional example 2, there is further advantage with respect to the area.

In this way, the high-speed charging and discharging operation in an about sampling frequency is carried out to a common mode reference in the conventional example 2 and the conventional example 3. Because a lack in convergence of the reference voltage causes degradation in the signal precision after the amplification, it is required to prepare a reference voltage source having a sufficient current supply performance and the high speed response performance. This leads to addition a new circuit such as a Low Drop Out (LDO) regulator and many pins, resulting in the cost increases.

In addition, there is another problem in a recent semiconductor circuit manufactured with a miniaturization process and driven with a low power supply voltage of about 1 V. In the miniaturization process, a MOS threshold value is comparatively high to the power supply voltage. Therefore, it is difficult to reduce the ON resistance of a switch which bypasses a voltage level (about 0.4 to 0.6 V in case of the power supply voltage of 1 V) which is selected as a common mode. For example, the seventh switch S7 and the eighth switch S8 in the conventional example 2 and the fifth switch S5 and the sixth switch S6 in the conventional example 3 are in the ON state in the amplification operation. However, it is difficult to reduce the ON resistance in case of using a realistic switch size, which causes reduction of the convergence speed and the degradation of the noise characteristic which is caused by the heat noise and so on.

Of the above-mentioned problem, the former problem of the reference voltage is called a first problem from now. Also, the latter problem of the ON resistance is called a second problem. In a first embodiment, a technique to solve the first problem is proposed. Also, in a second embodiment, a technique to solve the first problem and the second problem is proposed.

The passive amplification circuit according to an embodiment of the present invention will be described below with refers to the attached drawings.

Through a switching operation using a capacitance, a scheme of amplifying an input differential voltage signal to G times is proposed. Here, G is a gain and the value is contained in the range of 1<G<2.

Only two kinds of the power supply voltage and the ground voltage are required as the reference voltage and another reference voltage is not required. In the miniaturization process in recent years, for the improvement of robust property, the power supply voltage is generally supplied from LDO of an IC chip, and it is not a big problem to use the reference voltage of the power supply voltage level.

First Embodiment

Figure 4A:
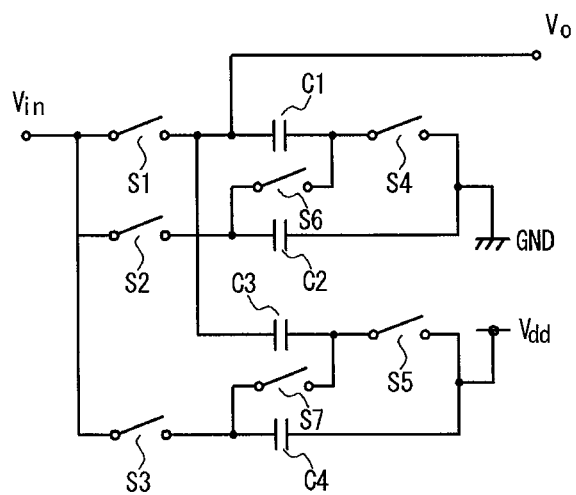
FIG. 4A is a diagram schematically showing the configuration example of the passive amplification circuit in a first embodiment of the present invention.

FIG. 4A is a diagram schematically showing a configuration example of the passive amplification circuit according to a first embodiment. In this circuit configuration, as described above, only a differential signal component of an input signal is amplified without requiring a common mode reference which needs high-speed charging and discharging operation. The passive amplifier shown in FIG. 4A is used as a voltage holding circuit section VH of an analog-digital converter shown in FIG. 9. A signal of a single end in this case is exemplified, but two passive amplification circuits are used according to a need, when a differential signal is supplied to the analog-digital converting circuit section ADC.

The component of the passive amplification circuit shown in FIG. 4A will be described. The passive amplification circuit shown in FIG. 4A has a first capacitance C1 to a fourth capacitance C4, and a first switch S1 to a seventh switch S7, an input terminal Vin, an output terminal Vo, a power supply voltage Vdd and the ground voltage GND. Here, the input terminal Vin receives an input signal. The output terminal Vo outputs an output signal to the analog-digital converting circuit section ADC. The power supply voltage Vdd supplies a power supply voltage. The ground voltage GND supplies the ground voltage.

The connection relation of each component shown in FIG. 4A will be described. The input terminal Vin is connected in common with one of the ends of the first switch S1, one of the ends of the second switch S2 and one of the ends of the third switch S3. The output terminal Vo is connected in common with the other end of the first switch S1, one of the ends of the first capacitance C1 and one of the ends of the third capacitance C3. The other end of the second switch S2 is connected in common with one of the ends of the sixth switch S6 and one of the ends of the second capacitance C2. The other end of the third switch S3 is connected in common with one of the ends of the seventh switch S7 and one of the ends of the fourth capacitance C4. The other end of the first capacitance C1 is connected in common with one of the ends of the fourth switch S4 and the other end of the sixth switch S6. The other end of the second capacitance C2 is connected in common with the other end of the fourth switch S4 and the ground voltage GND. The other end of the third capacitance C3 is connected in common with one of the ends of the fifth switch S5 and the other end of the seventh switch S7. The other end of the fourth capacitance C4 is connected in common with the other end of the fifth switch S5 and power Vdd.

The operation of the passive amplification circuit shown in FIG. 4A will be described. The first switch S1 to the fifth switch S5 are controlled so as to simultaneously carry out the switching between a block-off state and a conductive state all together as a first switch group. The sixth switch S6 and the seventh switch S7 are controlled so as to simultaneously carry out the switching between the block-off state and the conductive state all together as a second switch group, and so as to be independent from the first switch group.

The control of the first switch group and the second switch group is carried out in response to a first control signal and a second control signal which are generated by a control circuit (not shown).

Figure 4B:
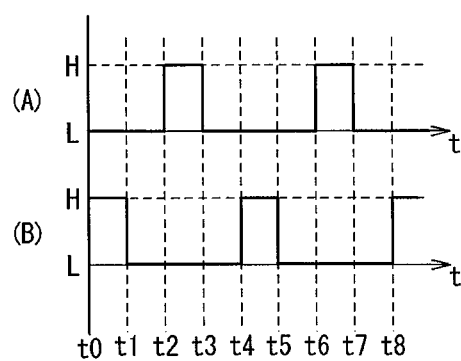
FIG. 4B is a time chart showing an example of the control signal to control each switch group shown in FIG. 4A.

FIG. 4B is a time chart showing an example of the control signal which controls each switch group shown in FIG. 4A. The time chart shown in FIG. 4B is the same as the time chart shown in FIG. 1B. Also, because the relation among the graphs shown in FIG. 4B, the above two control signals, and the above two switch groups is also same as that of FIG. 1B. Therefore, further detailed description is omitted.

In the passive amplification circuit shown in FIG. 4A, a sampling action of the input signal supplied to the input terminal Vin is carried out in each range of time periods t0 to t1, t4 to t5 and t8 and the subsequent. At this time, the first capacitance C1 and the second capacitance C2 are connected in parallel between the input terminal Vin and the ground voltage GND. Also, the third capacitance C3 and the fourth capacitance C4 are connected in parallel between the input terminal Vin and power Vdd.

Also, in the passive amplification circuit shown in FIG. 4A, the amplifying operation is carried out in the range of the time periods t2 to t3 and t6 to t7. At this time, the first capacitance C1 and the second capacitance C2 are connected in serial between the output terminal Vo and the ground voltage GND. Also, the third capacitance C3 and the fourth capacitance C4 are connected in serial between power Vdd and the output terminal Vo.

It is supposed that a capacitance value of each of the first capacitance C1 and the second capacitance C2 is Ca and a capacitance value of each of the third capacitance C3 and the fourth capacitance C4 is Cb. Moreover, calculating a charge quantity to have been charged in the first capacitance C1 to the fourth capacitance C4 in case of the sampling operation and a charge quantity to have been charged in case of the amplifying operation, it is described from a conservation rule of a total electric charge quantity that the voltage of the output terminal Vo in the amplifying operation is equal to 2(Vin+Vdd×Ca/(Ca+Cb)).

That is, by appropriately selecting the capacitance values Ca and Cb, it is possible to design the common mode voltage of the output signal. Thus, a function of an in-phase voltage shift circuit section VS can be realized. Moreover, it is possible to design an amplifying circuit having a voltage gain in a range of one or two times by connecting a capacitance not having an amplification function in parallel with a set of the capacitances which have such an amplification function.

Second Embodiment

FIG. 5A is a diagram schematically showing a configuration example of the passive amplification circuit according to a second embodiment. This configuration solves the problem of an ON resistance as the second problem in addition to the first problem solved in the first embodiment, and also does not require the common mode reference voltage. The passive amplifier shown in FIG. 5A is used as the voltage holding circuit section VH of the analog-digital converter shown in FIG. 9.

The components of the passive amplification circuit shown in FIG. 5A will be described. The passive amplification circuit shown in FIG. 5A has the first capacitance C1 to the fourth capacitance C4, the first switch S1T to a tenth switch S10, a positive side input terminal Vin+, a negative side input terminal Vin−, a positive side output terminal Vo+ and a negative side output terminal Vo−, the power supply voltage Vdd and the ground voltage GND. Here, the positive side input terminal Vin+ and the negative side input terminal Vin− receive the positive side voltage and the negative side voltage of the input signal, respectively. The positive side output terminal Vo+ and the negative side output terminal Vo− output the positive side voltage and the negative side voltage of the output signal to the analog-digital converting circuit section ADC. The power supply voltage Vdd supplies a power supply voltage. The ground voltage GND supplies the ground voltage.

The connection relation of the respective components shown in FIG. 5A will be described. The positive side input terminal Vin+ is connected in common with one of the ends of the first switch S1, one of the ends of the second switch S2 and one of the ends of the third switch S3. The power supply voltage Vdd is connected with one of the ends of the seventh switch S7 and one of the ends of the ninth switch S9. The ground voltage GND is connected with one of the ends of the eighth switch S8 and one of the ends of the tenth switch S10. One of the ends of the first capacitance C1 are connected with the other end of the first switch S1 and the other end of the seventh switch S7. One of the ends of the second capacitance C2 is connected with the other end of the second switch S2 and the other end of the eighth switch S8. The positive side output terminal Vo+ is connected in common with the other end of the third switch S3, one of the ends of the third capacitance C3 and one of the ends of the fourth capacitance C4. The negative side output terminal Vo− is connected in common with the other end of the first capacitance C1, the other end of the second capacitance C2 and one of the ends of the fourth switch S4. The other end of the third capacitance C3 is connected in common with one of the ends of the fifth switch S5 and the other end of the ninth switch S9. The other end of the fourth capacitance C4 is connected in common with one of the ends of the sixth switch S6 and the other end of the tenth switch S10. The negative side input terminal Vin− is connected in common with the other end of the fourth switch S4, the other end of the fifth switch S5 and the other end of the sixth switch S6.

The operation of the passive amplification circuit shown in FIG. 5A will be described. The first switch S1 to the sixth switch S6 are controlled so as to simultaneously carry out the switching between the block-off state and the conductive state all together as the first switch group. The seventh switch S7 to the tenth switch S10 are connected so as to simultaneously carry out the switching between the block-off state and the conductive state all together as the second switch group, while being independent from the first switch group.

The control of the first switch group and the second switch group is carried out in response to the first control signal and the second control signal generated by the control circuit (not shown).

Figure 5B:
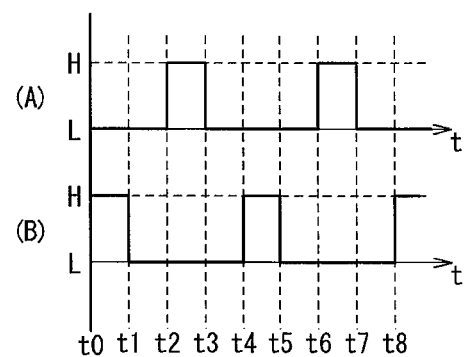
FIG. 5B is a time chart showing an example of the control signal to control each switch group shown in FIG. 5A.

FIG. 5B is a time chart showing an example of the control signal which controls each switch group shown in FIG. 5A. The time chart shown in FIG. 5B is the same as the time chart shown in FIG. 1B. Also, because the relation between each graph shown in FIG. 5B, the above two control signals, and the above two switch groups is same as the case of FIG. 1B. Therefore, further detailed description is omitted.

The passive amplification circuit shown in FIG. 5A carries out the sampling operation of the input signal received from the input terminal Vin in the range of time periods t0 to t1, t4 to t5, and t8 and the subsequent. At this time, the first capacitance C1 to the fourth capacitance C4 are connected in parallel between the positive side input terminal Vin+ and the negative side input terminal Vin−.

Here, in order to carry out the sampling operation of a high-speed input signal in high precision, it is general to use a boost switch. However, in order to generate the boosted voltage, it is required to dispose a sufficiently larger capacitance than a parasitic capacitance of a sampling switch in a boosting block. Therefore, the boost switch requires a large area cost. In the present embodiment, too, in order to carry out the sampling operation of a high-speed signal in a high precision, the boost switches have to be used as the first switch S1 to the sixth switch S6. However, the boosting block of the boost switch that has a same connection destination can be used in common. Therefore, an overhead of a larger area is not required, compared with a sampling block having no amplification mechanism.

Also, the passive amplification circuit shown in FIG. 5A carries out the amplifying operation in the range of the time periods t2 to t3 and t6 to t7. At this time, the power supply voltage Vdd, the first capacitance C1, the negative side output terminal Vo−, the second capacitance C2 and the ground voltage GND are connected in serial in this order. Also, the power supply voltage Vdd, the third capacitance C3, the positive side output terminal Vo+, the fourth capacitance C4 and the ground voltage GND are connected in serial in this order.

At this time, the voltages of the positive side output terminal Vo+ and the negative side output terminal Vo− are the voltage obtained by amplifying an input differential signal.

Here, it is supposed that a capacitance value of each of the first capacitance C1 and the third capacitance C3 is an identical Ca and a capacitance value of each of the second capacitance C2 and the fourth capacitance C4 is an identical Cb. Moreover, calculating the electric charge quantities to have been charged in the first capacitance C1 to the fourth capacitance C4 in case of the sampling operation and the electric charge quantities charged in case of the amplifying operation, it is described from the conservation rule of a total electric charge quantity that the voltage at the output terminal Vo in the amplifying operation is $2(\pm Vin + Vdd \times Ca/(Ca+Cb))$.

Therefore, in that the present embodiment, it is possible to design the common mode voltage of the output signal by appropriately selecting the capacitance values Ca and Cb, like the first embodiment. Thus, it is possible to have a function of the in-phase voltage shift circuit section V. Moreover, it is possible to design the voltage gain as the amplification circuit by connecting capacitance which does not have an amplification function in parallel to a set of the capacitances which have such an amplification function and by appropriately selecting the capacitance values of them.

Next, embodiments of the analog-digital converter will be described. The passive amplification circuit proposed in the first and second embodiments may be combined with these embodiments of the analog-digital converter.

The analog-digital converter according to the embodiments of the present invention will be described below with reference to the attached drawings.

Third Embodiment

Figure 6:
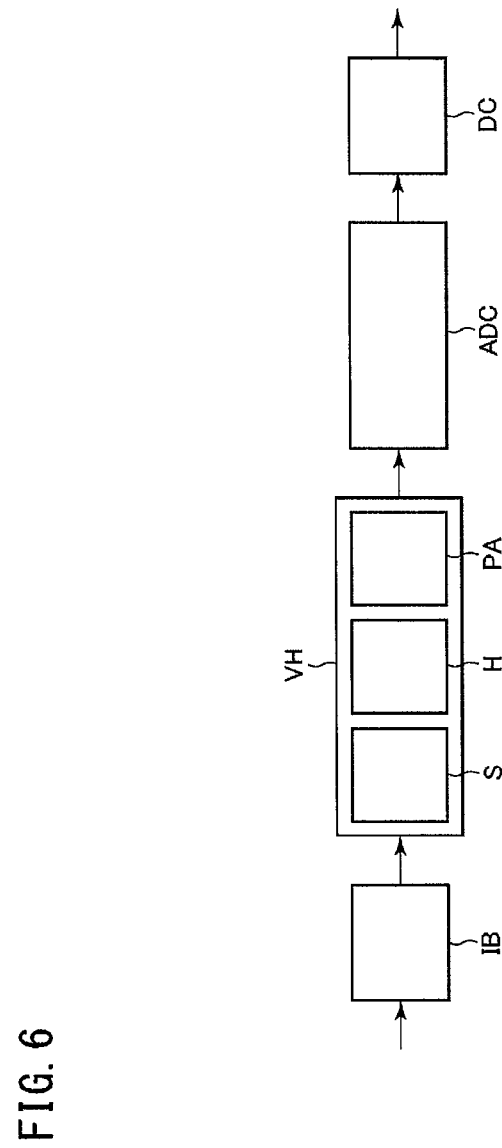
FIG. 6 is a functional block diagram showing the configuration of an analog-digital convertor in a third embodiment.

FIG. 6 is a functional block diagram showing a configuration of the analog-digital converter according to a third embodiment. The components of the analog-digital converter shown in FIG. 6 will be described.

The analog-digital converter shown in FIG. 6 contains an input buffer circuit section IB, a voltage holding circuit section VH, an analog-digital converting circuit section ADC and a digital correcting circuit section DC. The voltage holding circuit section VH contains a sampling circuit section S, a holding circuit section H and a passive amplification circuit section PA. Here, the sampling circuit section S, the holding circuit section H and the passive amplification circuit section PA cannot always separated clearly, and a part or all of the sections may be shared.

The connection relation of the components of the analog-digital converter shown in FIG. 6 will be described. The voltage holding circuit section VH is connected as the rear stage of the input buffer circuit section IB. The analog-digital converting circuit section ADC is connected as the rear stage of the voltage holding circuit section VH. The digital correcting circuit section DC is connected as the rear stage of the analog-digital converting circuit section ADC.

The operation of the components of the analog-digital converter shown in FIG. 6 will be described. The input buffer circuit section IB carries out a buffering operation of the input signal to drive a sampling capacitance of the voltage holding circuit section VH at a high speed and in a high precision. However, in the present embodiment, the input buffer circuit section IB is not an essential component and may be omitted. The voltage holding circuit section VH holds a voltage value of the input signal and a corresponding electric charge value effectively. More specifically, in the voltage holding circuit section VH, the sampling circuit section S carries out the sampling operation of the input signal, the holding circuit section H holds the voltage value of the sampled input signal and the corresponding electric charge value effectively, and the passive amplification circuit section PA carries out the passive amplification of the held input signal voltage. The analog-digital converting circuit section ADC carries out a digital change in an electric charge share-type successive approximation type analog-digital conversion to convert the analog signal into a digital signal. The digital correcting circuit section DC corrects a warp of the digital signal which is brought about based on a deviation of capacitance values in the analog-digital converting circuit section ADC when a high-effective resolution is required.

Figure 7:
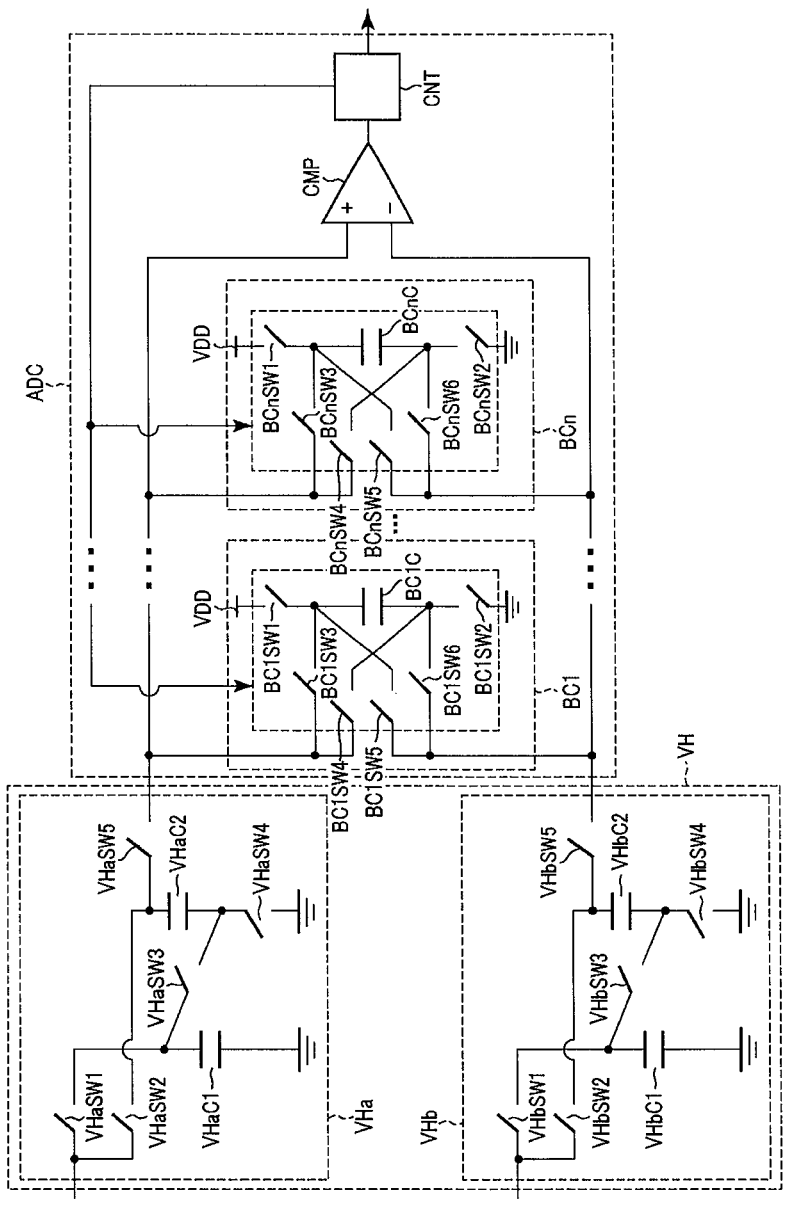
FIG. 7 is a diagram schematically showing the configuration of a voltage holding circuit section and the analog-digital converting circuit section in the third embodiment.

FIG. 7 is a diagram schematically showing the configuration of the voltage holding circuit section VH and the analog-digital converting circuit section ADC according to a third embodiment. The components shown in FIG. 7 will be described. The voltage holding circuit section VH contains a positive phase side voltage holding circuit section VHa and a negative phase side voltage holding circuit section VHb.

The components of the positive phase side voltage holding circuit section VHa will be described. The positive phase side voltage holding circuit section VHa contains first and second positive phase side capacitances VHaC1 and VHaC2 and first to fifth positive phase side switches VHaSW1 to VHaSW5. The negative phase side voltage holding circuit section VHb contains first and second negative phase side capacitances VHbC1 and VHbC2 and first to fifth negative phase side switches VHbSW1 to VHbSW5.

The analog-digital converting circuit section ADC contains first to $n^{th}$ bit comparison circuit sections BC1 to BCn, a comparator CMP and a control circuit section CNT. Here, "n" is an integer showing the number of digits of the digital value after the conversion.

The components of the first bit comparison circuit section B C1 will be described. The first bit comparison circuit section BC1 contains the capacitance BC1C and first to sixth switches BC1SW1 to BC1SW6. Note that the components of the first to $n^{th}$ bit comparison circuit sections are all same although the capacitance values of the capacitances BC1C to BCnC and the switch sizes for the bits are different. That is, when the first to $n^{th}$ bit digits is shown by "i", the capacitance value of the capacitance BCiC is an about half of that of the capacitance BC(i-1)C. Further detailed explanation of the bit comparison circuit section BCi for bits except the first bit is omitted.

The connection relation of the components of the voltage holding circuit section VH and the analog-digital converting circuit section ADC shown in FIG. 7 will be described.

At first, the connection relation of the components of the positive phase side voltage holding circuit section VHa will be described. An input section of the positive phase side voltage holding circuit section VHa is connected in common with one of the ends of the first positive phase side switch VHaSW1 and one of the ends of the second positive phase side switch VHaSW2. The other end of the first positive phase side switch VHaSW1 is connected in common with one of the ends of the third positive phase side switch VHaSW3 and one of the ends of the first positive phase side capacitance VHaC1. The other end of the third positive phase side switch VHaSW3 is connected in common with one of the ends of the fourth positive phase side switch VHaSW4 and one of the ends of the second positive phase side capacitance VHaC2. The other end of the first positive phase side capacitance VHaC1 is grounded. The other end of the fourth positive phase side switch VHaSW4 is grounded. The other end of the second positive phase side switch VHaSW2 and the other end of the second positive phase side capacitance VHaC2 are connected in common with one of the ends of the fifth positive phase side switch VHaSW5. The other end of the fifth positive phase side switch VHaSW5 is connected with the output section of the positive phase side voltage holding circuit section VHa.

Because the connection relation of the components of the negative phase side voltage holding circuit section VHb are same as those of the positive phase side voltage holding circuit section VHa, further detailed description is omitted.

Next, the connection relation of the analog-digital converting circuit section ADC will be described. An output section of the positive phase side voltage holding circuit section VHa is connected in common with a non-inversion side input section in each of the first to the $n^{th}$ bit comparison circuit sections and a non-inversion side input section of the comparator CMP. An output section of the negative phase side voltage holding circuit section VHb is connected in common with an inversion side input section of each of first to $n^{th}$ bit comparison circuit sections and an inversion side input section of the comparator CMP. An output section of the comparator CMP is connected with the input section of the control circuit section CNT. An output section of the control circuit section CNT is connected with the output section of the analog-digital converting circuit section ADC.

The connection relation of the components of the first bit comparison circuit section BC1 will be described. One of the ends of the first switch BC1SW1 is connected with the power supply voltage VDD. One of the ends of the second switch BC1SW2 is grounded. One of the ends of each of the third switch BC1SW3 and the fourth switch BC1SW4 is connected with the output section of the positive phase side voltage holding circuit section VHa. One of the ends of each of the fifth switch BC1SW5 and the sixth switch BC1SW6 is connected with the output section of the negative phase side voltage holding circuit section VHb. The other end of each of the first switch BC1SW1, the third switch BC1SW3 and the fifth switch BC1SW5 is connected with one of the ends of the capacitance BC1C. The other end of each of the second switch BC1SW2, the fourth switch BC1SW4 and the sixth switch BC1SW6 is connected with the other end of the capacitance BC1C.

Because the connection relation of the components of the first to $n^{th}$ bit comparison circuit sections BC1 to BCn is same, further detailed description is omitted.

The operation of the analog-digital converter according to the third embodiment will be described. At first, the input buffer circuit section IB receives and buffers an analog signal. The input buffer circuit section IB outputs a voltage corresponding to an analog value of the received analog signal for the voltage holding circuit section VH.

The operation of the voltage holding circuit section VH according to the third embodiment will be described. The voltage holding circuit section VH carries out the sampling operation of the analog input signal by the sampling circuit section S, the holding circuit section H carries out the holding operation of the sampled voltage and the passive amplification circuit section PA carries out the passive amplification of the held voltage. More specifically, the voltage holding circuit section VH carries out the sampling operation, the voltage holding and the passive amplification by alternately changing the first state shown in FIG. 8A and FIG. 8B and the second state shown in FIG. 8C and FIG. 8D.

Figure 8A:
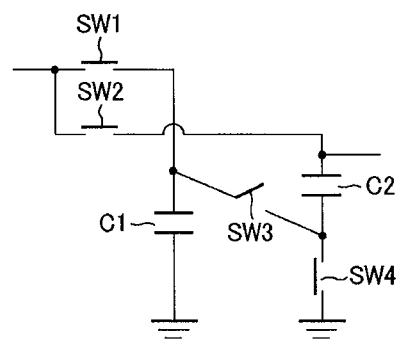
FIG. 8A is a diagram schematically showing a first state in each of a positive phase side voltage holding circuit section and a negative phase side voltage holding circuit section in the third embodiment.

FIG. 8A is a diagram schematically showing a first state in each of the positive phase side voltage holding circuit section VHa and the negative phase side voltage holding circuit section VHb according to the third embodiment. A circuit diagram shown in FIG. 8A contains the input section, the first capacitance C1, the second capacitance C2, the first to fourth switches SW1 to SW4 and the output section. Here, the input section and the output section shown in FIG. 8A correspond to the input section and the output section in each of the positive phase side voltage holding circuit section VHa and the negative phase side voltage holding circuit section VHb shown in FIG. 7, respectively. The first capacitance C1 shown in FIG. 8A and the second capacitance C2 correspond to the first positive phase side capacitance VHaC1 shown in FIG. 7, the first negative phase side capacitance VHbC1, the second positive phase side capacitance VHaC2 of the and the negative phase side capacitance VHbC2 of the second respectively. The first to fourth switches SW1 to SW4 shown in FIG. 8A corresponds to the first to fourth positive phase side switches VHaSW1 to VHaSW4 shown in FIG. 7 and the first to the fourth negative phase side switches VHbSW1 to VHbSW4, respectively.

In the first state schematically shown in FIG. 8A, the first switch SW1, the second switch SW2 and the fourth switch SW4 are in the conductive state, and the third switch SW3 is in the block-off state. At this time, note that it is desirable that the fifth positive phase side switch VHaSW5 and the fifth negative phase side switch VHbSW5 shown in FIG. 7 are in the block-off state.

Figure 8B:
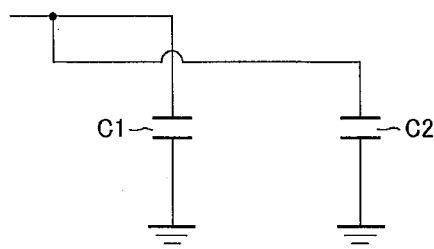
FIG. 8B is an equivalent circuit diagram corresponding to the first state in each of the positive phase side voltage holding circuit section and the negative phase side voltage holding circuit section in the third embodiment.

FIG. 8B is an equivalent circuit diagram corresponding to the first state in each of the positive phase side voltage holding circuit section VHa and the negative phase side voltage holding circuit section VHb according to the third embodiment. The equivalent circuit diagram shown in FIG. 8B contains the input section, the first capacitance C1 and the second capacitance C2. In this case, like the case shown in FIG. 8A, the input section, the first capacitance C1 and the second capacitance C2 shown in FIG. 8B correspond to the input section of each of the positive phase side voltage holding circuit section VHa and the negative phase side voltage holding circuit section VHb, the first positive phase side capacitance VHaC1 and the first negative phase side capacitance VHbC1, and the first positive phase side capacitance VHaC2 and the second negative phase side capacitance VHbC2, respectively. It should be noted that because the fifth positive phase side switch VHaSW5 and the fifth negative phase side switch VHbSW5 of the positive phase side voltage holding circuit section VHa and the negative phase side voltage holding circuit section VHb are in the block-off state in the first state, the output section is omitted in FIG. 8B.

In the first state shown in FIG. 8A and FIG. 8B, in the two of the capacitances C1 and C2, one of the ends is connected with the input section and the other end is grounded. In other words, at the first state shown in FIG. 8A and FIG. 8B, the two capacitances C1 and C2 are connected in parallel between the input section and the ground voltage.

Figure 8C:
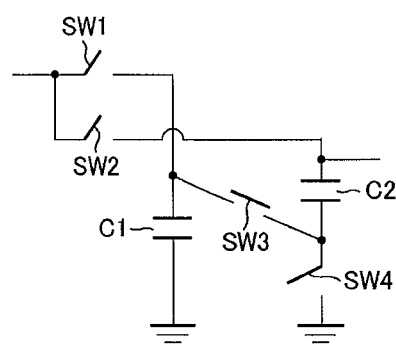
FIG. 8C is a diagram schematically showing a second state in each of the positive phase side voltage holding circuit section and the negative phase side voltage holding circuit section in the third embodiment.

FIG. 8C is a diagram schematically showing the second state in each of the positive phase side voltage holding circuit section VHa and the negative phase side voltage holding circuit section VHb according to the third embodiment. The circuit diagram schematically shown in FIG. 8C contains the first capacitance C1, the second capacitance C2 and the first to the fourth switches SW1 to SW4. In this case, the first capacitance C1 and the second capacitance C2 shown in FIG. 8C correspond to the first positive phase side capacitance VHaC1 and the first negative phase side capacitance VHbC1, and the second positive phase side capacitance VHaC2 and the second negative phase side capacitance VHbC2 shown in FIG. 7, respectively. The first to fourth switches SW1 to SW4 shown in FIG. 8C correspond to the first to fourth positive phase side switches VHaSW1 to VHaSW4, and the first to fourth negative phase side switches VHbSW1 to VHbSW4, shown in FIG. 7, respectively.

In the first state schematically shown in FIG. 8C, the first switch SW1, the second switch SW2 and the fourth switch SW4 are in the block-off state, and the third switch SW3 is in the conductive state. It should be noted that the fifth positive phase side switch VHaSW5 and the fifth negative phase side switch VHbSW5 shown in FIG. 7 are set to the conductive state at the time of the analog-digital conversion processing.

Figure 8D:
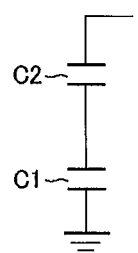
FIG. 8D is an equivalent circuit diagram corresponding to the second state in each of the positive phase side voltage holding circuit section and the negative phase side voltage holding circuit section in the third embodiment.

FIG. 8D is an equivalent circuit diagram corresponding to the second state in each of the positive phase side voltage holding circuit section VHa and the negative phase side voltage holding circuit section VHb according to the third embodiment. The equivalent circuit diagram shown in FIG. 8D contains the first capacitance C1 and the second capacitance C2. In this case, like the case of FIG. 8C, the first capacitance C1 and the second capacitance C2 correspond to the first positive phase side capacitance VHaC1 and the first negative phase side capacitance VHbC1, and the second negative phase side capacitance VHbC2 and the second positive phase side capacitance VHaC2, respectively.

In the second state shown in FIG. 8C and FIG. 8D, one of the ends of the first capacitance C1 is grounded, and the other end of the first capacitance C1 is connected with one of the ends of the second capacitance C2. The other end of the second capacitance C2 is connected with the output section. In other words, in the second state shown in FIG. 8C and FIG. 8D, the two of the capacitances C1 and C2 are connected in serial between the output section and the ground voltage.

In this case, the passive amplification in a case where the capacitance values of the first and second capacitances C1 and C2 are equal to each other, the power supply voltage VDD is 1.2 V and the voltage of the input signal changes in a range of 0 to 0.6 V will be described as an example.

At first, in the first state, the first capacitance C1 and the second capacitance C2 are charged in parallel when the voltage of an analog signal outputted from the input buffer circuit section IB shown in FIG. 6 is applied. At this time, the first capacitance C1 and the second capacitance C2 which are connected in parallel are charged with the sampling voltage which is contained in the range of 0 to 0.6 V.

Next, in the second state, the first switch SW1 and the second switch SW2 are blocked off or isolated from each other, to finish the charging operation of the first capacitance C1 and the second capacitance C2, i.e. to complete the sampling operation. Also, the states of the third switch SW3 and the fourth switch SW4 are switched so that the connection relation of the first capacitance C1 and the second capacitance C2 is switched from the serial connection to the parallel connection. At this time, the voltage between both ends of the first and second capacitances C1 and C2 serially-connected is fallen in the range of 0 to 1.2 V, i.e. the passive amplification has been carried out. Moreover, the state of the fifth switch SW5 is switched, and the voltage after the passive amplification is effectively held and is applied to the analog-digital converting circuit section of the rear stage.

In this way, before analog-digital change operation, in the voltage amplitude of vibration of the input signal, by being amplified beforehand, the input change value of the noise which the comparator CMP generates can be reduced by half by twice. As a result, the effective resolution increases in the degree for 1 bit, i.e. the precision of the analog-digital change becomes by twice. Because the passive amplification can be realized only by the nexus exchange by the capacitance, it isn't accompanied by the increase of the consumption electric current and the chip size.

It should be noted that a ratio of the passive amplification is determined based on a ratio of the capacitance values of the first and second capacitances C1 and C2. As mentioned above, if the two capacitance values are equal to each other, the ratio of the passive amplification is about twice. It is possible to change the ratio of the passive amplification freely by suitability controlling the ratio of the two capacitance values.

The analog-digital converting circuit section ADC according to the present embodiment shown in FIG. 7 operates in the same way as a general electric charge share-type successive approximation type analog-digital converting circuit. At this time, when the comparator CMP compares the voltage between its ends of the capacitance in the successive approximation from the MSB corresponding to the first bit comparison circuit section BC1 to the LSB corresponding to the $n^{th}$ bit comparison circuit section BCn, the control circuit section CNT suitability switches each switch between the conductive state and the block-off state.

In the third embodiment, the capacitance value of the first capacitance C1 is the same as that of the second capacitance C2. Therefore, the voltage obtained after the passive amplification is about twice of the voltage before the passive amplification. By amplifying the voltage showing an analog value twice before the analog-digital conversion by the analog-digital converting circuit section ADC, a input conversion value of noise which is generated through the comparing operation by the comparator CMP can be suppressed to a half. As a result, because the precision of the analog-digital conversion becomes twice, the effective resolution increases by about 1 bit.

Also, because the passive amplification can be realized only by switching the connection of the capacitances, it does not require the increase of the consumption power and the chip size. It should be noted that the control of the switch group whose states are switched in the passive amplification may be carried out by the control circuit section CNT which is contained in the analog-digital converting circuit section ADC and another control circuit section which is not shown.

Fourth Embodiment

FIG. 9 is a functional block diagram showing the configuration of the analog-digital converter according to the fourth embodiment. The analog-digital converter in the present embodiment shown in FIG. 9 is the same as a circuit obtained by adding the in-phase voltage shift circuit section VS to the analog-digital converter according to the third embodiment shown in FIG. 6. Here, the in-phase voltage shift circuit section VS in the present embodiment is contained in the voltage holding circuit section VH. Because the other configuration of the analog-digital converter in the present embodiment shown in FIG. 9 is the same as that of the third embodiment shown in FIG. 6, further detailed description is omitted.

Figure 10:
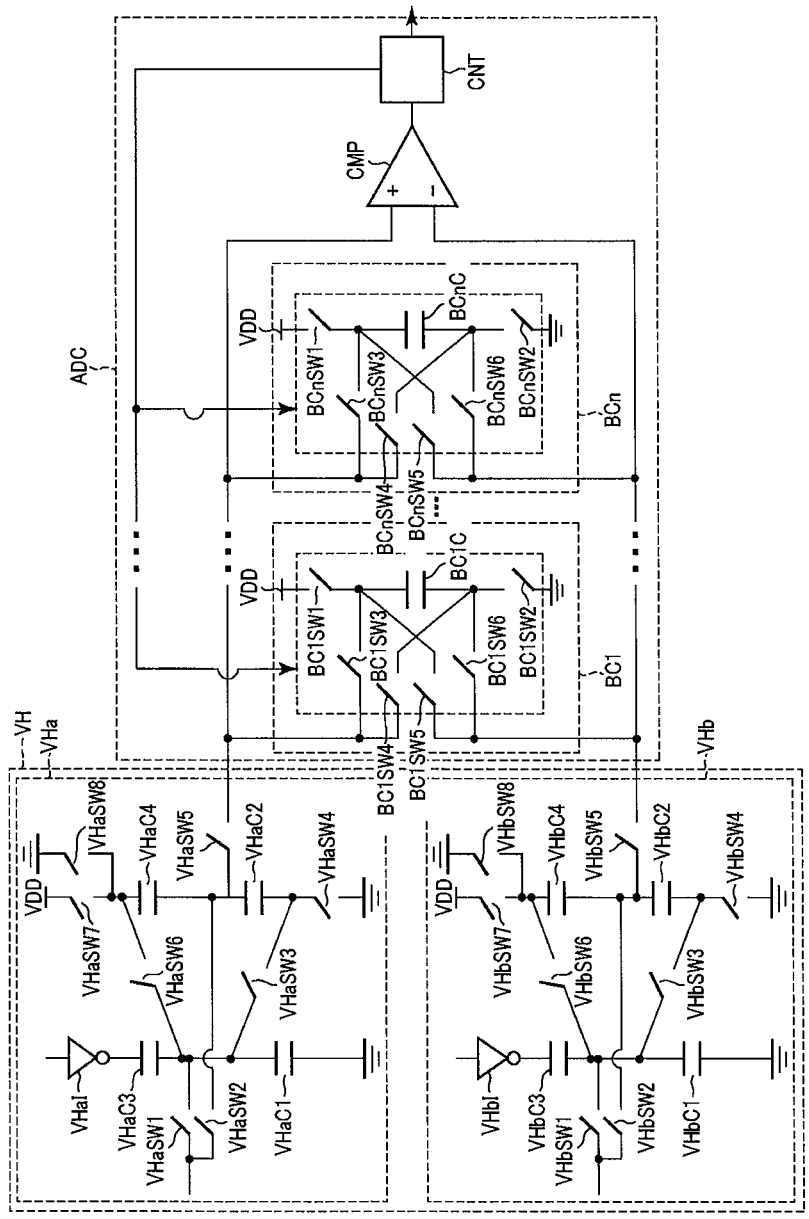
FIG. 10 is a diagram schematically showing the configuration of a voltage holding circuit section VH and the analog-digital converting circuit section in the fourth embodiment.

FIG. 10 is a diagram schematically showing the configuration of the voltage holding circuit section VH and the analog-digital converting circuit section ADC according to the fourth embodiment. The voltage holding circuit section VH in the present embodiment shown in FIG. 9 is the same as a circuit obtained by adding the following changes to the voltage holding circuit section VH of the third embodiment shown in FIG. 7.

That is, the positive phase side voltage holding circuit section VHa of the voltage holding circuit section VH in the present embodiment is obtained by adding the positive phase side inverter VHaI, a third positive phase side capacitance VHaC3, a fourth positive phase side capacitance VHaC4, and the sixth to the eighth positive phase side switches VHaSW6 to VHaSW8 to the positive phase side voltage holding circuit section VHa in the third embodiment shown in FIG. 7.

Here, the input section of the positive phase side inverter VHaI is connected with a control signal generating section (not shown). The output section of the positive phase side inverter VHaI is connected with one of the ends of the third positive phase side capacitance VHaC3. The other end of the third positive phase side capacitance VHaC3 and one of the ends of the sixth positive phase side switch VHaSW6 are connected in common with one of the ends of the first positive phase side capacitance VHaC1, the other end of the first positive phase side switch VHaSW1 and one of the ends of the third positive phase side switch VHaSW3. One of the ends of the seventh positive phase side switch VHaSW7 is connected with the power supply voltage VDD. One of the ends of the eighth positive phase side switch VHaSW8 is grounded. The other end of the sixth positive phase side switch VHaSW6, the other end of the seventh positive phase side switch VHaSW7 and the other end of the eighth positive phase side switch VHaSW8 are connected in common with one of the ends of the fourth positive phase side capacitance VHaC4. The other end of the fourth positive phase side capacitance VHaC4 is connected in common with one of the ends of the second positive phase side capacitance VHaC2, the other end of the second positive phase side switch VHaSW2 and one of the ends of the fifth positive phase side switch VHaSW5.

Also, the negative phase side voltage holding circuit section VHb of the voltage holding circuit section VH in the present embodiment is obtained by adding the negative phase side inverter VHbI, the third negative phase side capacitance VHbC3, the fourth negative phase side capacitance VHbC4, and the sixth to eighth negative phase side switches VHbSW6 to VHbSW8 to the negative phase side voltage holding circuit section VHb in the third embodiment shown in FIG. 7.

Here, the input section of the negative phase side inverter VHbI is connected with the control signal generating section (not shown). The output section of the negative phase side inverter VHbI is connected with one of the ends of the third negative phase side capacitance VHbC3. The other end of the third negative phase side capacitance VHbC3 and one of the ends of the sixth negative phase side switch VHbSW6 are connected in common with one of the ends of the first negative phase side capacitance VHbC1, the other end of the first negative phase side switch VHbSW1 and one of the ends of the third negative phase side switch VHbSW3. One of the ends of the seventh negative phase side switch VHbSW7 is connected with the power supply voltage VDD. One of the ends of the eighth negative phase side switch VHbSW8 is grounded. The other end of the sixth negative phase side switch VHbSW6, the other end of the seventh negative phase side switch VHbSW7 and the other end of the eighth negative phase side switch VHbSW8 are connected in common with one of the ends of the fourth negative phase side capacitance VHbC4. The other end of the fourth negative phase side capacitance VHbC4 is connected in common with one of the ends of the second negative phase side capacitance VHbC2, the other end of the second negative phase side switch VHbSW2 and one of the ends of the fifth negative phase side switch VHbSW5.

It should be noted that because the other configuration of the voltage holding circuit section VH in the present embodiment is the same as that of the third embodiment shown in FIG. 7, further detailed description is omitted.

It will be described that the voltage holding circuit section VH in the present embodiment has a function as the in-phase voltage shift circuit section VS by adding the above changes.

Figure 11A:
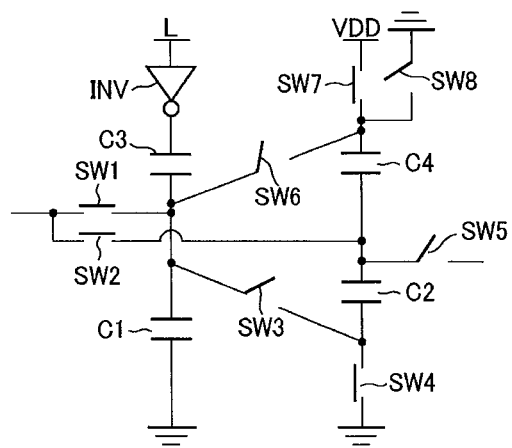
FIG. 11A is a diagram schematically showing the first state which is common to the positive phase side voltage holding circuit section and the negative phase side voltage holding circuit section in the fourth embodiment.
Figure 11B:
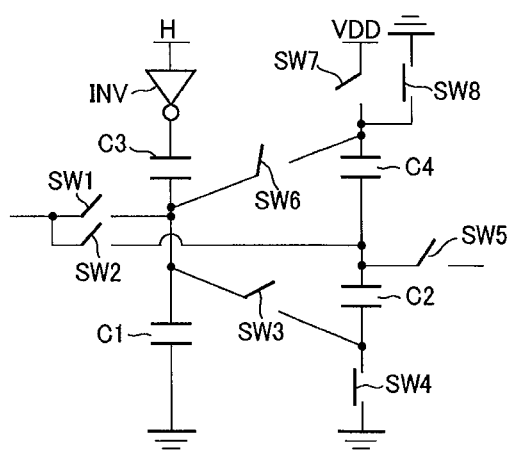
FIG. 11B is a diagram schematically showing the second state which is common to the positive phase side voltage holding circuit section and the negative phase side voltage holding circuit section in the fourth embodiment.
Figure 11C:
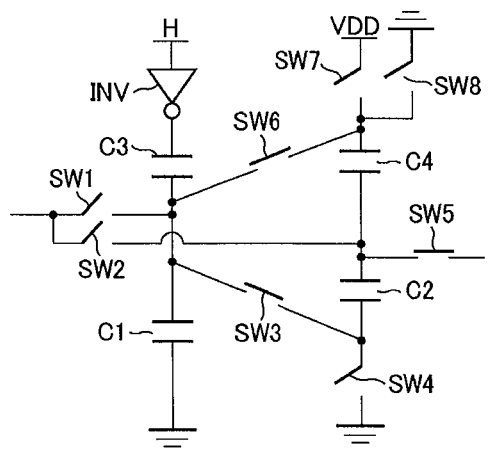
FIG. 11C is a diagram schematically showing a third state which is common to the positive phase side voltage holding circuit section and the negative phase side voltage holding circuit section in the fourth embodiment.

FIG. 11A is a diagram schematically showing the first state which is common to the positive phase side voltage holding circuit section VHa and the negative phase side voltage holding circuit section VHb in the fourth embodiment. FIG. 11B is a diagram schematically showing the second state which is common to the positive phase side voltage holding circuit section VHa and the negative phase side voltage holding circuit section VHb in the fourth embodiment. FIG. 11C is a diagram schematically showing the third state which is common to the positive phase side voltage holding circuit section VHa and the negative phase side voltage holding circuit section VHb in the fourth embodiment.

The circuit diagrams shown in FIG. 11A to FIG. 11C contain the first to fourth capacitances C1 to C4, the first to eighth switches SW1 to SW8 and an inverter INV. Here, the first to fourth capacitances C1 to C4 shown in FIG. 11A to FIG. 11C correspond to the first to fourth positive phase side capacitances VHaC1 to VHaC4 shown in FIG. 10 and the first to fourth negative phase side capacitances VHbC1 to VHbC4 shown in FIG. 10, respectively. The first to eighth switches SW1 to SW8 shown in FIG. 11A to FIG. 11C correspond to the first to eighth positive phase side switches VHaSW1 to VHaSW8 shown in FIG. 10, and the first to eighth negative phase side switches VHbSW1 to VHbSW8 shown in FIG. 10, respectively. The inverter INV shown in FIG. 11A to FIG. 11C corresponds to the positive phase side inverter VHaI shown in FIG. 10 and the negative phase side inverter VHbI shown in FIG. 10. Because the connection relation of the components shown in FIG. 11A to FIG. 11C is same as that of the positive phase side voltage holding circuit section VHa and the negative phase side voltage holding circuit section VHb shown in FIG. 10, further detailed description is omitted.

In the first state schematically shown in FIG. 11A, the first, second, fourth and seventh switches SW1, SW2, SW4 and SW7 are in the conductive state. The third, fifth, sixth and eighth switches SW3, SW5, SW6 and SW8 are in the block-off state. The input signal to the inverter INV is in a low state. In the second state schematically shown in FIG. 11B, the fourth and eighth switches SW4 and SW8 are in the conductive state. The first to third, and fifth to seventh switches SW1 to SW3 and SW5 to SW7 are in the block-off state and the input signal to the inverter INV is in a high state. In the third state schematically shown in FIG. 11C, the third, fifth and sixth switch SW3, SW5 and SW6 are in the conductive state. The first, second, fourth, seventh and eighth switches SW1, SW2, SW4, SW7 and SW8 are in the block-off state and the input signal to the inverter INV is in the high state.

Figure 12A:
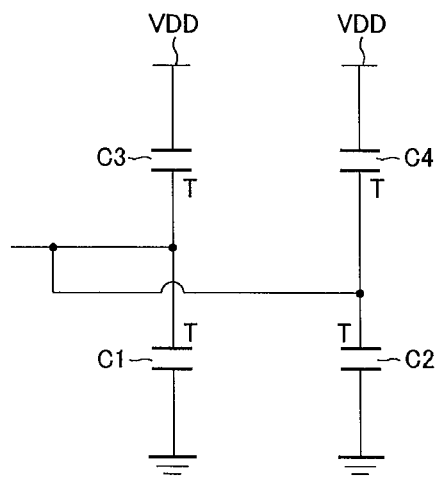
FIG. 12A is an equivalent circuit diagram showing the first state which is common to the positive phase side voltage holding circuit section and the negative phase side voltage holding circuit section in the fourth embodiment shown in FIG. 11A.
Figure 12B:
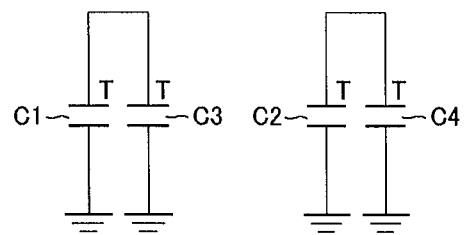
FIG. 12B is an equivalent circuit diagram showing the second state which is common to the positive phase side voltage holding circuit section and the negative phase side voltage holding circuit section in the fourth embodiment shown in FIG. 11B.
Figure 12C:
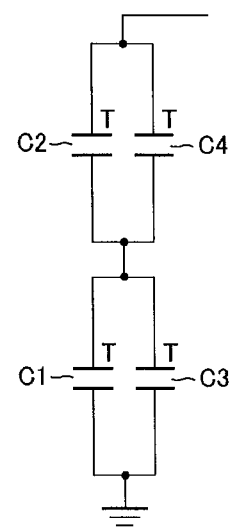
FIG. 12C is an equivalent circuit diagram showing the third state which is common to the positive phase side voltage holding circuit section and the negative phase side voltage holding circuit section in the fourth embodiment shown in FIG. 11C.

FIG. 12A is an equivalent circuit diagram schematically showing the first state which is common to the positive phase side voltage holding circuit section VHa and the negative phase side voltage holding circuit section VHb in the fourth embodiment shown in FIG. 11A. FIG. 12B is an equivalent circuit diagram showing the second state which is common to the positive phase side voltage holding circuit section VHa and the negative phase side voltage holding circuit section VHb in the fourth embodiment shown in FIG. 11B. FIG. 12C is an equivalent circuit diagram showing the third state which is common to the positive phase side voltage holding circuit section VHa and the negative phase side voltage holding circuit section VHb in the fourth embodiment shown in FIG. 11C.

The equivalent circuits shown in FIG. 12A to FIG. 12C contains the first to fourth capacitance C1 to C4. Here, the first to fourth capacitances C1 to C4 shown in FIG. 12A to FIG. 12C correspond to the first to fourth positive phase side capacitances VHaC1 to VHaC4 shown in FIG. 10 and the first to fourth negative phase side capacitances VHbC1 to VHbC4 shown in FIG. 10, like the case of FIG. 11A to FIG. 11C, respectively.

In the first state shown in the equivalent circuit of FIG. 12A, one of the ends of each of the first to fourth capacitances C1 to C4 is connected with the input section of the positive phase side voltage holding circuit section VHa or the negative phase side voltage holding circuit section VHb. The other end of each of the first and second capacitances C1 and C2 is grounded. The other end of each of the third and fourth capacitances C3 and C4 is connected with the power supply voltage VDD.

In FIG. 12A, the above "one of the ends" is expressed by "T" in each of these capacitances C1 to C4. Note that this notation is the same as in FIG. 12B and FIG. 12C to be mentioned later.

Here, a case where the capacitance value of each of the first to fourth capacitances C1 to C4 is identical as an example, the voltage of the power supply voltage VDD is 1.2 V and the input voltage changes in a range of 0.3 to 0.9 V will be described.

In the first state, the sampling operation of the input voltage is carried out. That is, in the first state, the voltage inputted to the positive phase side voltage holding circuit section VHa or the negative phase side voltage holding circuit section VHb is applied to the first and second capacitances C1 and C2. This voltage is contained in a range of 0.3 to 0.9 V. Also, a voltage difference between the power supply voltage VDD and the voltage inputted to the positive phase side voltage holding circuit section VHa or the negative phase side voltage holding circuit section VHb is applied the third and fourth capacitances C3 and C4. When calculating this voltage difference, the following result is obtained:

$$1.2-0.3=0.9$$

$$1.2-0.9=0.3$$

Therefore, these voltages are contained in the range of 0.3 to 0.9 V.

When the sampling operation in the first state completes, the state shifts to the second state.

In the second state shown in the equivalent circuit of FIG. 12B, ones of the ends of the first and third capacitances C1 and C3 are connected to each other, ones of the ends of each of the second and fourth capacitances C2 and C4 are connected to each other, and the other ends of the first to fourth capacitances C1 to C4 are grounded. In other words, the connection destinations of the third and fourth capacitances C3 and C4 are switched from the power supply voltage to the ground voltage.

By shifting from the first state to the second state, the in-phase voltage shift is carried out. That is, in the second state, until the voltage values become equal in each of the first and third capacitances C1 and C3, the electric charge moves between the first and third capacitances C1 and C3. In the same way, the electric charge moves between the second and fourth capacitance C2 and C4. As a result, in this example, the voltage range in each of the first to fourth capacitance C1 to C4 falls from input signal voltage range of 0.3 to 0.9 V by 0.3 V and shifts to a range of 0 to 0.6 V. Here, because the voltage range after the shift is equal to a first half of the range from the ground voltage to the power supply voltage, the voltage after the amplification does not exceed the power supply voltage VDD of 1.2 V voltage even if twice passive amplification is carried out.

In the third state shown in the equivalent circuit of FIG. 12C, one of the ends of each of the second and fourth capacitances C2 and C4 is connected with the output section. The other end of each of the second and fourth capacitances C2 and C4 is connected to one of the ends of one of the first and third capacitances C1 and C3. The other end of each of the first and third capacitances C1 and C3 is grounded.

In the third state, the voltage after the in-phase voltage shift is passive-amplified and is held. That is, in the third state, because the voltages of the first to fourth capacitance C1 to C4 are in a range of 0 to 0.6 V, and the capacitance values of the first to fourth capacitances C1 to C4 are identical, the voltage of the output section is increased to twice by changing the connection state to the serial connection, and the range spreads to 0 to 1.2 V.

As shown in the above-mentioned example, the voltage holding circuit section VH in the present embodiment can convert the input signal which changes in the range of 0.3 to 0.9 V by using the in-phase voltage shift and the passive amplification to the output signal which changes in the range of 0 to 1.2 V, and holds the conversion result.

In the fourth embodiment, like the case of the third embodiment, an input conversion value of noise generated by the comparator can be reduced to about a half by previously amplifying the voltage amplitude of the input signal to twice. As a result, the effective resolution increases by about 1 bit, i.e. the precision of the analog-digital conversion becomes twice. Also, because the in-phase voltage shift and the passive amplification can be realized only by changing the connection relation of the capacitances, the increase of the consumed current and the chip size is not accompanied.

Here, like the case of the third embodiment, it is possible to determine a ratio of the passive amplification in the present embodiment based on the ratio of the capacitance values of the first to fourth capacitances C1 to C4 and to suitably control this ratio of the capacitance values.

Because the operation of the analog-digital converting circuit section ADC is the same as that of the third embodiment, further detailed description is omitted.

Fifth Embodiment

Figure 13:
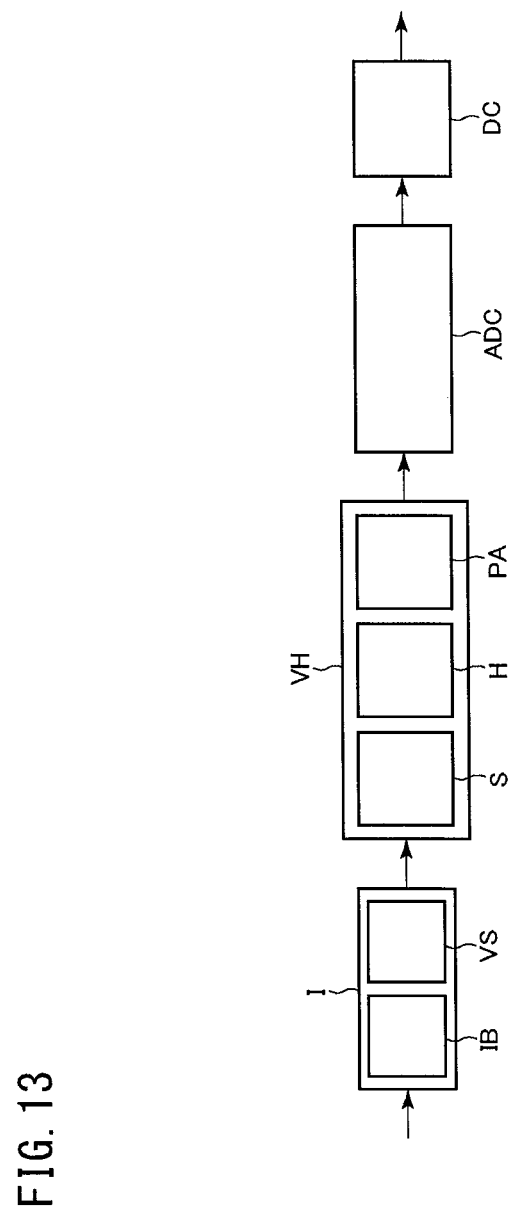
FIG. 13 is a functional block diagram showing the configuration of the analog-digital convertor in a fifth embodiment.

FIG. 13 is a functional block diagram showing the configuration of the analog-digital converter in the fifth embodiment. The configuration of the analog-digital converter shown in FIG. 13 is identical to that of the converter obtained by applying the following changes to the analog-digital converter in the third embodiment shown in FIG. 6. That is, the in-phase voltage shift circuit section VS is added to the analog-digital converter shown in FIG. 6. Here, the in-phase voltage shift circuit section VS is provided at the front stage of the voltage holding circuit section VH. The in-phase voltage shift circuit section VS provided at the front stage of the voltage holding circuit section VH and the input buffer circuit section IB are collectively called the input circuit section I.

Because the other configuration of the analog-digital converter shown in FIG. 13 is that same as that of the third embodiment shown in FIG. 6, further detailed description is omitted.

Figure 14:
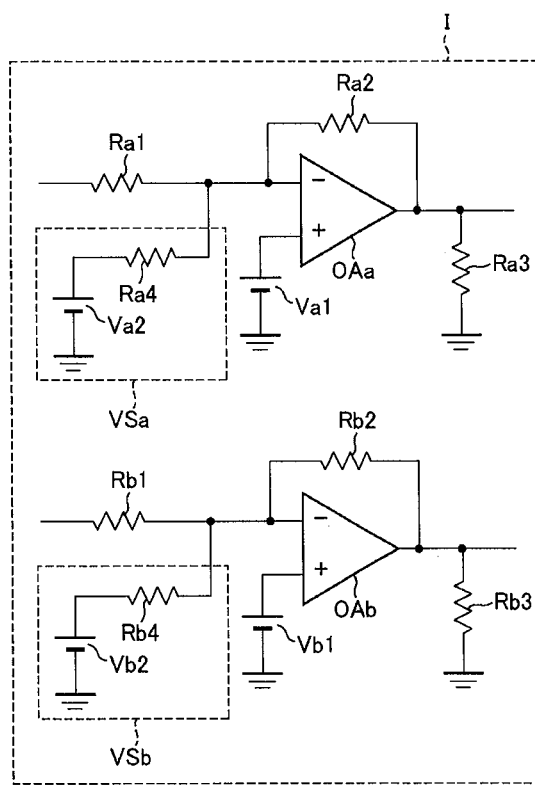
FIG. 14 is a diagram schematically showing the configuration of an input circuit section in the fifth embodiment.

FIG. 14 is a diagram schematically showing the configuration of the input circuit section I in the fifth embodiment. The components of the input circuit section I shown in FIG. 14 will be described.

The input circuit section I shown in FIG. 14 contains a positive phase side operational amplifier OAa, the first to fourth positive phase side resistances Ra1 to Ra4, first and second positive phase side power supply voltages Va1 and Va2, a negative phase side operational amplifier OAb, the first to fourth negative phase side resistances Rb1 to Rb4, and the first and second negative phase side power supply voltages Vb1 and Vb2. Among these, the fourth positive phase side resistance Ra4 and the second positive phase side power supply voltage Va2 are collectively called the positive phase side in-phase voltage shift circuit section VSa. In the same way, the fourth negative phase side resistance Rb4 and the second negative phase side power supply voltage Vb2 are collectively called the negative phase side in-phase voltage shift circuit section VSb.

The connection relation of the components of the input circuit section I shown in FIG. 14 will be described. The positive phase side input section of the input circuit section I is connected with one of the ends of the first positive phase side resistance Ra1. The other end of the first positive phase side resistance Ra1 is connected in common with one of the ends of the second positive phase side resistance Rat, one of the ends of the fourth positive phase side resistance Ra4 and the non-inversion side input section of the positive phase side operational amplifier OAa. The other end of the fourth positive phase side resistance Ra4 is connected with the positive side end of the second positive phase side power supply voltage Va2. The negative side end of the second positive phase side power supply voltage Va2 is grounded. The positive side end of the first positive phase side power supply voltage Va1 is connected with the inversion side input section of the positive phase side operational amplifier OAa. The negative side end of the first positive phase side power supply voltage Va1 is grounded. The output section of the positive phase side operational amplifier OAa is connected in common with the other end of the second positive phase side resistance Rat and one of the ends of the third positive phase side resistance Ra3. The other end of the third positive phase side resistance Ra3 is connected with the positive phase side output section of the input circuit section I.

A negative phase side input section of the input circuit section I is connected with one of the ends of the first negative phase side resistance Rb1. The other end of the first negative phase side resistance Rb1 is connected in common with one of the ends of the second negative phase side resistance Rb2, one of the ends of the fourth negative phase side resistance Rb4 and the non-inversion side input section of the negative phase side operational amplifier OAb. The other end of the fourth negative phase side resistance Rb4 is connected with the positive side end of the second negative phase side power supply voltage Vb2. The negative side end of the second negative phase side power supply voltage Vb2 is grounded. The positive side end of the first negative phase side power supply voltage Vb1 is connected with the inversion side input section of the negative phase side operational amplifier OAb. The negative side end of the first negative phase side power supply voltage Vb1 is grounded. The output section of the negative phase side operational amplifier OAb is connected in common with the other end of the second negative phase side resistance Rb2 and one of the ends of the third negative phase side resistance Rb3. The other end of the third negative phase side resistance Rb3 is connected with the negative phase side output section of the input circuit section I.

In the positive phase side circuit section of the input circuit section I in the present embodiment, an input buffer function is realized by the positive phase side operational amplifier OAa by a resistance feed-back using the second positive phase side resistance Rat. Also, the in-phase voltage shift function is realized by connecting the positive phase side in-phase voltage shift circuit section VSa to the inversion side input section of the positive phase side operational amplifier OAa. At this time, the second positive phase side power supply voltage Va2 and the fourth positive phase side resistance Ra4 contained in the positive phase side in-phase voltage shift circuit section VSa function as the DC voltage source for the positive phase side shift and the positive phase side shift resistance, respectively. The addition of the in-phase voltages is carried out through the addition circuit operation by the positive phase side operational amplifier OAa. It is possible to add the desired negative in-phase voltages by appropriately setting the voltage value of the second positive phase side power supply voltage Va2 which functions as the DC voltage source for the positive phase side shift.

In the same way, in the negative phase side circuit section of the input circuit section I in the present embodiment, the input buffer function is realized by the negative phase side operational amplifier OAb by a resistance feed-back using the second negative phase side resistance Rb2. Also, the in-phase voltage shift function is realized by connecting the negative phase side in-phase voltage shift circuit section VSb with the inversion side input section of the negative phase side operational amplifier OAb. At this time, the second negative phase side power supply voltage Vb2 which is contained in the negative phase side in-phase voltage shift circuit section VSb and the fourth negative phase side resistance Rb4 function as the DC voltage source for the negative phase side shift and the resistance for the negative phase side shift, respectively. The in-phase voltage addition is carried out by an addition circuit operation by the negative phase side operational amplifier OAb. It is possible to add the desired negative in-phase voltages by appropriately setting the voltage value of the second negative phase side power Vb2 which functions as the DC voltage source for the negative phase side shift.

It should be noted that in an example shown in FIG. 14, although the operational amplifier of the single end is used, it is possible to carry out the in-phase voltage shift, even when a full differential type operational amplifier is used.

In the fifth embodiment, like the case of the third and fourth embodiments, an input conversion value of noise generated by the comparator can be reduced to about a half, by previously amplifying the voltage amplitude of the input signal to twice. As a result, the effective resolution increases for about 1 bit, i.e. the precision of the analog-digital conversion becomes higher to twice. Also, because the passive amplification can be realized only by changing the connection relation of the capacitances, the increase of consumed current and the chip size is not accompanied.

Sixth Embodiment

Figure 15:
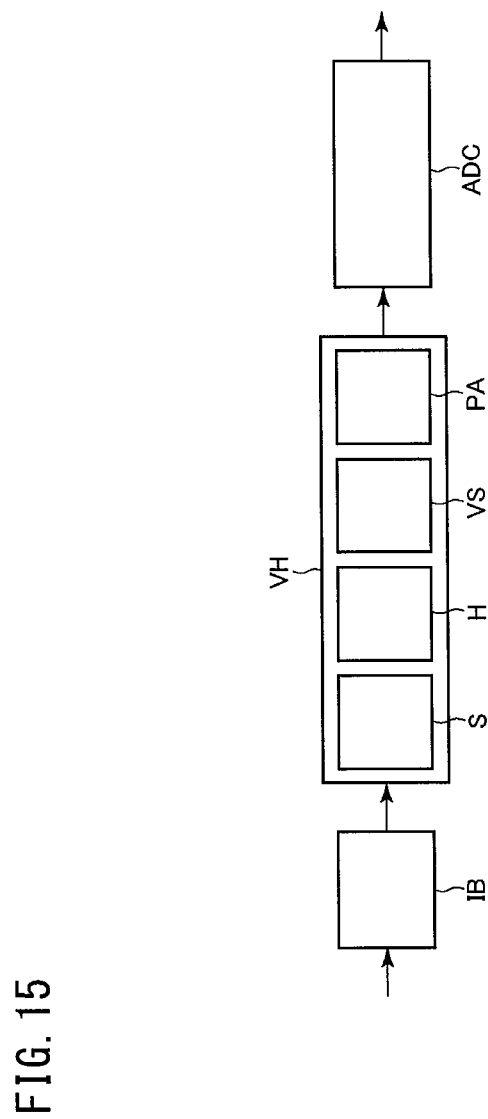
FIG. 15 is a functional block diagram showing the configuration of the analog-digital convertor in a sixth embodiment.

FIG. 15 is a functional block diagram showing the configuration of the analog-digital converter in the sixth embodiment. The analog-digital converter shown in FIG. 15 is a converter obtained by removing the digital correcting circuit section DC from the analog-digital converter in the fourth embodiment shown in FIG. 9. It should be noted that because the other configuration of the analog-digital converter in the present embodiment shown in FIG. 15 is same as that of the fourth embodiment shown in FIG. 9, further detailed description is omitted.

Because the analog-digital converter of the present embodiment shown in FIG. 15 does not have the digital correcting circuit section, a warp of the digital signal caused due to a deviation of capacitances of the analog-digital converting circuit section ADC cannot be removed. Therefore, the high effective resolution for 11 bits or more cannot be obtained. However, in the present embodiment can reduce an influence by the noise of the comparator CMP by the passive amplification which is carried out of the voltage holding circuit section VH like those of the first to fifth embodiments. Therefore, according to the present embodiment, the analog-digital converter which has the effective resolution of about 10 bits can be realized in the lower consumed power.

Seventh Embodiment

Figure 16:
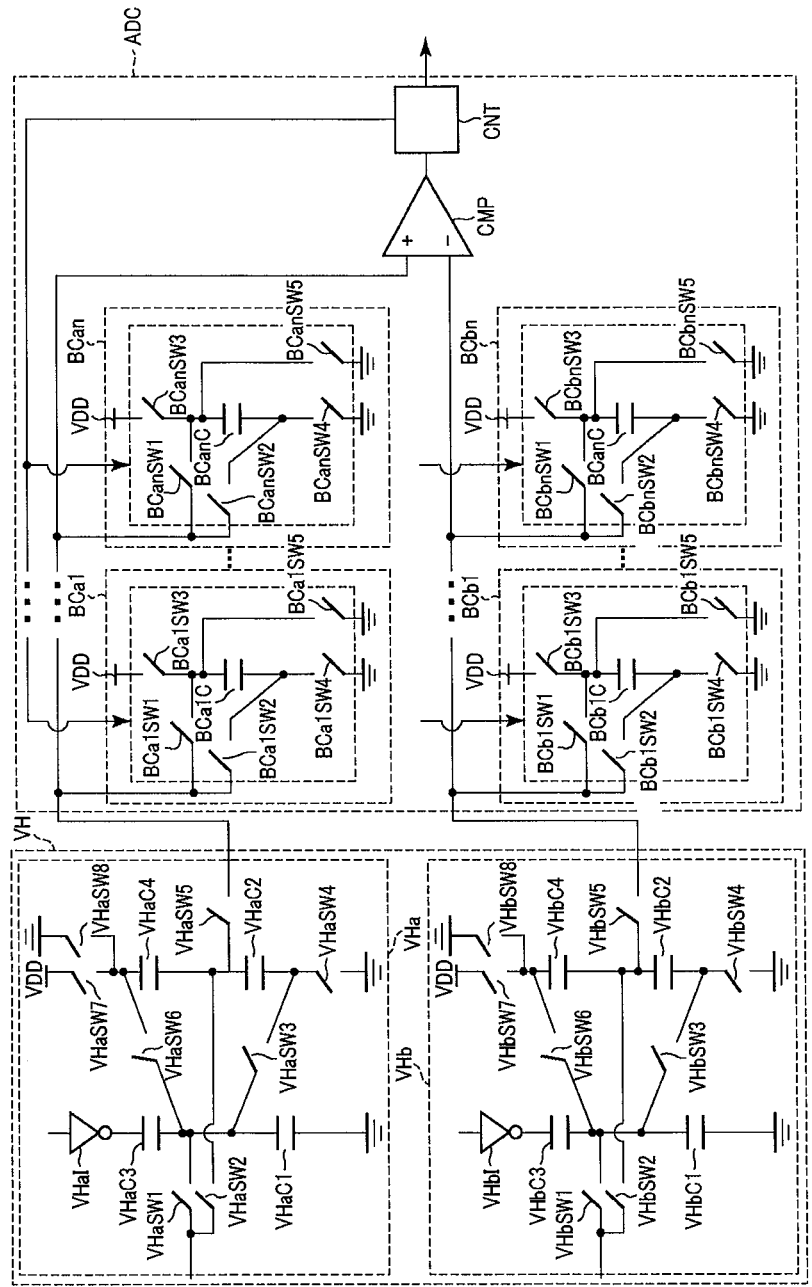
FIG. 16 is a diagram schematically showing the configuration of a voltage holding circuit section and the analog-digital converting circuit section in a seventh embodiment.

FIG. 16 is a diagram schematically showing the configuration of the voltage holding circuit section VH and the analog-digital converting circuit section ADC in the seventh embodiment. It should be noted that because the overall configuration of the analog-digital converter in the present embodiment is the same as that of the fourth embodiment shown in FIG. 9, illustration and further detailed explanation are omitted.

Because the configuration of the voltage holding circuit section VH in the present embodiment shown in FIG. 16 is the same as that of the fourth embodiment shown in FIG. 10, further detailed description is omitted.

The components of the analog-digital converting circuit section ADC in the present embodiment shown in FIG. 16 will be described.

The analog-digital converting circuit section ADC in the present embodiment shown in FIG. 16 contains the first to $n^{th}$ positive phase side bit comparison circuit sections BCa1 to BCan, the first to $n^{th}$ negative phase side bit comparison circuit sections BCb1 to BCbn, a comparator CMP and a control circuit section CNT.

A component at the first positive phase side bit comparison circuit section BCa1 will be described. The first positive phase side bit comparison circuit section BCa1 contains a capacitance BCa1C and the first to fifth switches BCa1SW1 to BCa1SW5.

The connection relation of the components of the first positive phase side bit comparison circuit section BCa1 will be described. The output section of the positive phase side voltage holding circuit section VHa is connected in common with one of the ends of each of the first and second switches BCa1SW1 and BCa1SW2. The other end of the first switch BCa1SW1 is connected in common with one of the ends of each of the third and the fifth switches BCa1SW3 and BCa1SW5 and one of the ends of the capacitance BCaC. The other end of the second switch BCa1SW2 is connected in common with one of the ends of the fourth switch BCa1SW4 and the other end of the capacitance BCaC. The other end of the third switch BCa1SW3 is connected with the power supply voltage VDD. The other end of the fourth switch BCa1SW4 is grounded. The other end of the fifth switch BCa1SW5 is grounded.

Because the configuration of the second to $n^{th}$ positive phase side bit comparison circuit sections BCa2 to BCan is the same as that of the first positive phase side bit comparison circuit section BCa1, further detailed explanation is omitted. Also, because the configuration of the first to $n^{th}$ negative phase side bit comparison circuit sections BCb1 to BCbn is the same as those of the first to $n^{th}$ positive phase side bit comparison circuit sections BCa1 to BCan, further detailed description is omitted.

The non-inversion side input section of the comparator CMP is connected with the output section of the positive phase side voltage holding circuit section VHa. The inversion side input section of the comparator CMP is connected with the output section of the negative phase side voltage holding circuit section VHb. The output section of the comparator CMP is connected with the input section of the control circuit section CNT. The control signal output section of the control circuit section is connected with control signal input sections (not shown) of the first to fifth switches of each of the first to $n^{th}$ positive phase side bit comparison circuit sections BCa1 to BCan and the first to $n^{th}$ negative phase side bit comparison circuit sections BCb1 to BCbn.

In this way, each capacitance which is contained in the analog-digital converting circuit section ADC in the present embodiment is of a to-ground type, and is connected between each differential node and the ground voltage, different from the fourth embodiment in which the floating connection is carried between the differential nodes.

The analog-digital converter in the present embodiment has two advantages, compared with the fourth embodiment. The first advantage is in that reduction of the amplification factor from twice can be made smaller in the present embodiment. Generally, in the electric charge share-type successive approximation type analog-digital converter, the electric charge sharing between the sampling capacitance and each of the digital-analog conversion capacitances progresses with the progress of the conversion step from the MSB to the LSB. Therefore, when the passive amplification is not carried out, an effective signal gain at the time of the LSB judgment reduced from one time in accordance with the following equation (1).

$$\text{Gain\_conv} = \frac{Cs}{Ctotal} = \frac{Cs}{Cs + 2\sum_i 2Ci} = \frac{Cs}{Cs + 4\sum_i Ci} \quad (1)$$

In the above-mentioned equation (1), "Gain_Conv" shows an effective signal gain, "Cs" shows a sampling capacitance value and "Ci" shows a capacitance value of the analog-digital conversion capacitance to carry out the judgment of the $i^{th}$ bit. When the passive amplification is carried out like the fourth embodiment, the effective gain is calculated from the following equation (2).

$$\text{Gain\_amp} = \frac{\frac{1}{2}Cs}{Ctotal} = \frac{\frac{1}{2}Cs}{\frac{1}{4}Cs + 2\sum_i Ci} = \frac{Cs}{\frac{1}{2}Cs + 4\sum_i Ci} \quad (2)$$

In the present embodiment, the effective gain is calculated from the following equation (3), unlike the fourth embodiment.

$$\text{Gain\_amp} = \frac{\frac{1}{2}Cs}{Ctotal} = \frac{\frac{1}{2}Cs}{\frac{1}{4}Cs + \sum_i Ci} = \frac{Cs}{\frac{1}{2}Cs + 2\sum_i Ci} \quad (3)$$

In this way, the effective gain which is obtained in the present embodiment is higher than that of the fourth embodiment. In the analog-digital conversion using the capacitance of a floating type like the fourth embodiment, the capacitance value in the view from the differential signal is twice of the floating capacitance value and it affects the electric charge sharing.

The second advantage is in that the in-phase voltage falls with the progress of the conversion step from the MSB to the LSB. The reason is because the electric charge sharing progresses between the sampling capacitances and the analog-digital conversion capacitances. The in-phase voltage after the passive amplification is VDD/2 but this is not desirable when the ON resistance of each switch using a MOS structure is made small. In case of the fourth embodiment, because each analog-digital conversion capacitance is subjected to the floating connection between the differential circuits, it seems to be an open connection in the view of from the in-phase component. Therefore, the in-phase voltage is left to be VDD/2 even if the conversion step progresses. However, in the present embodiment, the in-phase voltage falls promptly to a sufficiently small value of about 0.4 V in the early stage of the conversion step according to the following equation (4). Therefore, the gate—source voltage of the NMOS switch becomes large, so that the ON resistance can be made small in the same switch size and the analog-digital conversion can carried out in a higher speed.

$$V_{CM} = \frac{1}{2}V_{DD} \cdot \frac{\frac{1}{4}Cs}{\frac{1}{4}Cs + \sum_i Ci} = \frac{1}{2}V_{DD} \cdot \frac{Cs}{Cs + 4\sum_i Ci} \quad (4)$$

Eighth Embodiment

Figure 17:
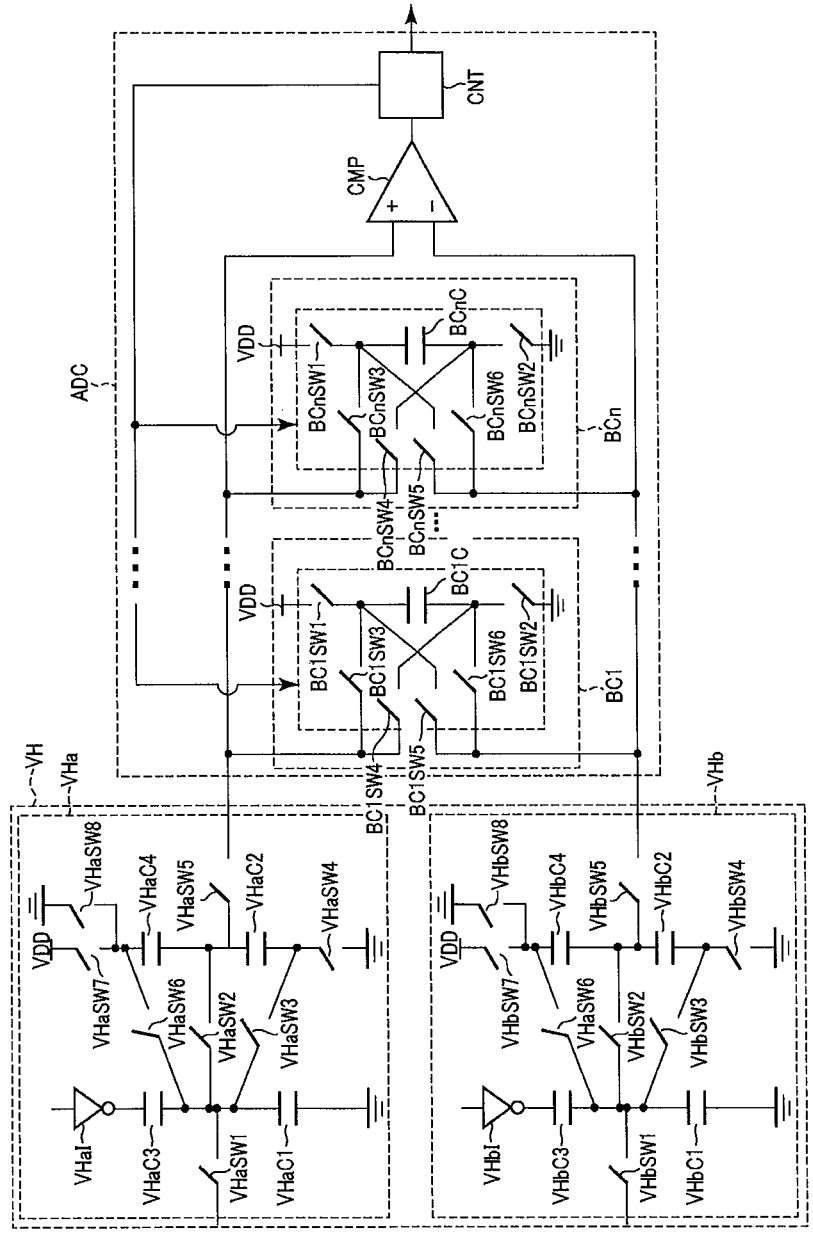
FIG. 17 is a diagram schematically showing the configuration of the voltage holding circuit section and the analog-digital converting circuit section in an eighth embodiment.

FIG. 17 is a diagram schematically showing the configuration of the voltage holding circuit section VH and the analog-digital converting circuit section ADC in an eighth embodiment. It should be noted that because the overall configuration of the analog-digital converter in the present embodiment is the same as that of the fourth embodiment shown in FIG. 9, further detailed description is omitted.

The components of the voltage holding circuit section VH and the analog-digital converting circuit section ADC in the present embodiment shown in FIG. 17 will be described. The voltage holding circuit section VH in the present embodiment is the same as a circuit section obtained by applying the following changes to the voltage holding circuit section VH in the fourth embodiment shown in FIG. 10. That is, a connection destination of the one of the ends of the second positive phase side switch VHaSW2 is changed from the input section of the positive phase side voltage holding circuit section VHa to the other end of the first positive phase side switch VHaSW1. Also, a connection destination of the one of the ends of the second negative phase side switch VHbSW2 is changed from the input section at negative phase side voltage holding circuit section VHb to the other end of the first negative phase side switch VHbSW1.

Because the other configuration of the voltage holding circuit section VH in the present embodiment shown in FIG. 17 is the same as that of the fourth embodiment shown in FIG. 10, further detailed description is omitted. Also, because the configuration of the analog-digital converting circuit section ADC in the present embodiment shown in FIG. 17 is the same as that of the fourth embodiment shown in FIG. 10, further detailed description is omitted.

In the positive phase side voltage holding circuit section VHa in the present embodiment, the first and third positive phase side capacitance VHaC1 and VHaC3 is connected with the input section of the positive phase side voltage holding circuit section VHa through the first positive phase side switch VHaSW1. However, the second and fourth positive phase side capacitances VHaC2 and VHaC4 are connected with the input section of the positive phase side voltage holding circuit section VHa through the second positive phase side switch VHaSW2 in addition to the first positive phase side switch VHaSW1.

Because the negative phase side voltage holding circuit section VHb in the present embodiment is similar to the positive phase side voltage holding circuit section VHa, further detailed description is omitted.

The voltage holding circuit section VH in the present embodiment can carry out the sampling operation, the in-phase voltage shift operation and the passive amplifying operation in order, by suitably switching a state of each of the first and second positive phase side switches VHaSW1 and VHaSW2 and the first and second negative phase side switches VHbSW1 and VHbSW2.

Figure 18A:
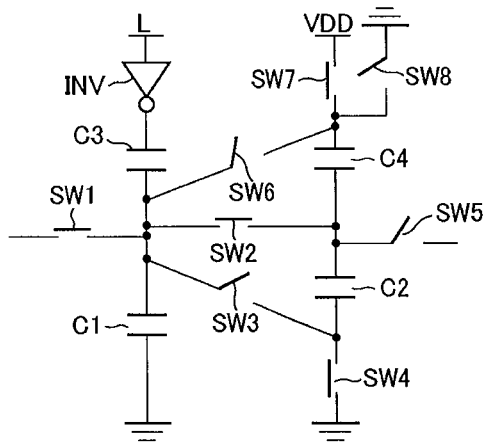
FIG. 18A is a diagram schematically showing the first state in each of the positive phase side voltage holding circuit section and the negative phase side voltage holding circuit section in the eighth embodiment.
Figure 18B:
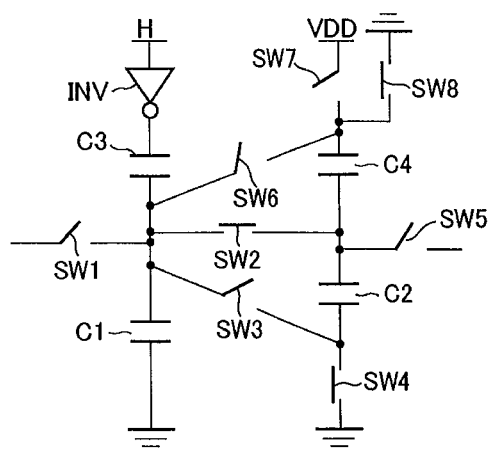
FIG. 18B is a diagram schematically showing the second state in each of the positive phase side voltage holding circuit section and the negative phase side voltage holding circuit section in the eighth embodiment.
Figure 18C:
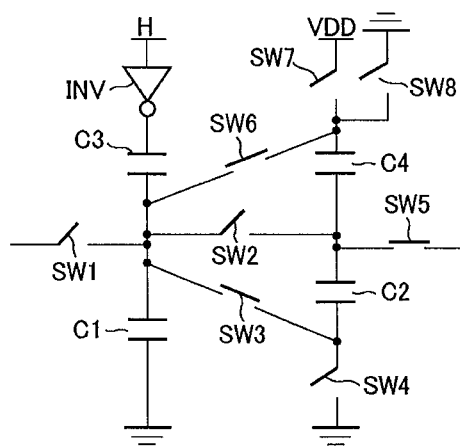
FIG. 18C is a diagram schematically showing the third state in each of the positive phase side voltage holding circuit section and the negative phase side voltage holding circuit section in the eighth embodiment.

The operation of the voltage holding circuit section VH in the present embodiment will be described. FIG. 18A is a diagram schematically showing the first state of each of the positive phase side voltage holding circuit section VHa and the negative phase side voltage holding circuit section VHb in the eighth embodiment. FIG. 18B is a diagram schematically showing the second state of each of the positive phase side voltage holding circuit section VHa and the negative phase side voltage holding circuit section VHb in the eighth embodiment. FIG. 18C is a diagram schematically showing the third condition of each of the positive phase side voltage holding circuit section VHa and the negative phase side voltage holding circuit section VHb in the eighth embodiment.

FIG. 18A to FIG. 18C are obtained by applying the following changes to FIG. 11A to FIG. 11C which shows the first, second and third states in each of the positive phase side voltage holding circuit section VHa and the negative phase side voltage holding circuit section VHb in the fourth embodiment. That is, the connection destination of the one of the ends of the second switch SW2 is changed from the input section of the positive phase side voltage holding circuit section VHa or the negative phase side voltage holding circuit section VHb to the other end of the first switch SW1. Because the other components shown by each of FIGS. 18A to 18C of the FIG. and the connection relation of these components are the same as those of each of FIGS. 11A to 11C, further detailed description is omitted.

In the first state shown in FIG. 18A, the second switch SW2 is in the conductive state and the states of the remaining first, and third to eighth switches SW1 and SW3 to SW8 are the same as those of the fourth embodiment shown in FIG. 11A. Therefore, the equivalent circuits of the positive phase side voltage holding circuit section VHa and the negative phase side voltage holding circuit section VHb in the first state shown in FIG. 18A are the same as those of the fourth embodiment shown in FIG. 12A. That is, the sampling operation of the input voltage is carried out even in the first state of the present embodiment shown in FIG. 18A, like the fourth embodiment.

In the second state shown in FIG. 18B, the second switch SW2 is in the conductive state and the states of the remaining first, and third to eighth switches SW1 and SW3 to SW8 are the same as those of the fourth embodiment shown in FIG. 11B.

In the third state shown in FIG. 18C, the second switch SW2 is in the block-off state and the states of the remaining first, and third to eighth switches SW1 and SW3 to SW8 are the same as those of the fourth embodiment shown in FIG. 11C. Therefore, the equivalent circuits of the positive phase side voltage holding circuit section VHa and the negative phase side voltage holding circuit section VHb in the third state shown in FIG. 18C are same as those of the fourth embodiment shown in FIG. 12C. That is, like the fourth embodiment, the voltage after the in-phase voltage shift is passive-amplified and is held even in the third state of the present embodiment shown in FIG. 18C.

In this way, because the voltage holding circuit section VH in the present embodiment, too, operates like the fourth embodiment, the effect like the fourth embodiment is obtained.

Ninth Embodiment

Because the overall configuration of the analog-digital converter in the ninth embodiment is same as that of the fourth embodiment shown in FIG. 9, further detailed description is omitted. The configuration of the voltage holding circuit section VH in the present embodiment is obtained by applying the following changes to the voltage holding circuit section VH in the fourth embodiment shown in FIG. 10. That is, a capacitance value is changed in each of the first to fourth positive phase side capacitances VHaC1 to VHaC4 and the first to fourth negative phase side capacitances VHbC1 to VHbC4. Specifically:

the capacitance value of the first positive phase side capacitance VHaC1=2×the capacitance value of of the second positive phase side capacitance VHaC2, the capacitance value of the third positive phase side capacitance VHaC3=2×the capacitance value of the fourth positive phase side capacitance VHaC4, the capacitance value of the first negative phase side capacitance VHbC1=2×the capacitance value of the second negative phase side capacitance VHbC2, and The capacitance value of the third negative phase side capacitance VHbC3=2×the capacitance value of the fourth negative phase side capacitance.

Because the other configuration of the voltage holding circuit section VH in the present embodiment is same as that of the fourth embodiment shown in FIG. 9, further detailed description is omitted.

Because the analog-digital converter in the present embodiment can carry out the same operation as in the fourth embodiment, including the passive amplification of twice, the same effect as in the fourth embodiment is obtained.

Tenth Embodiment

Figure 19:
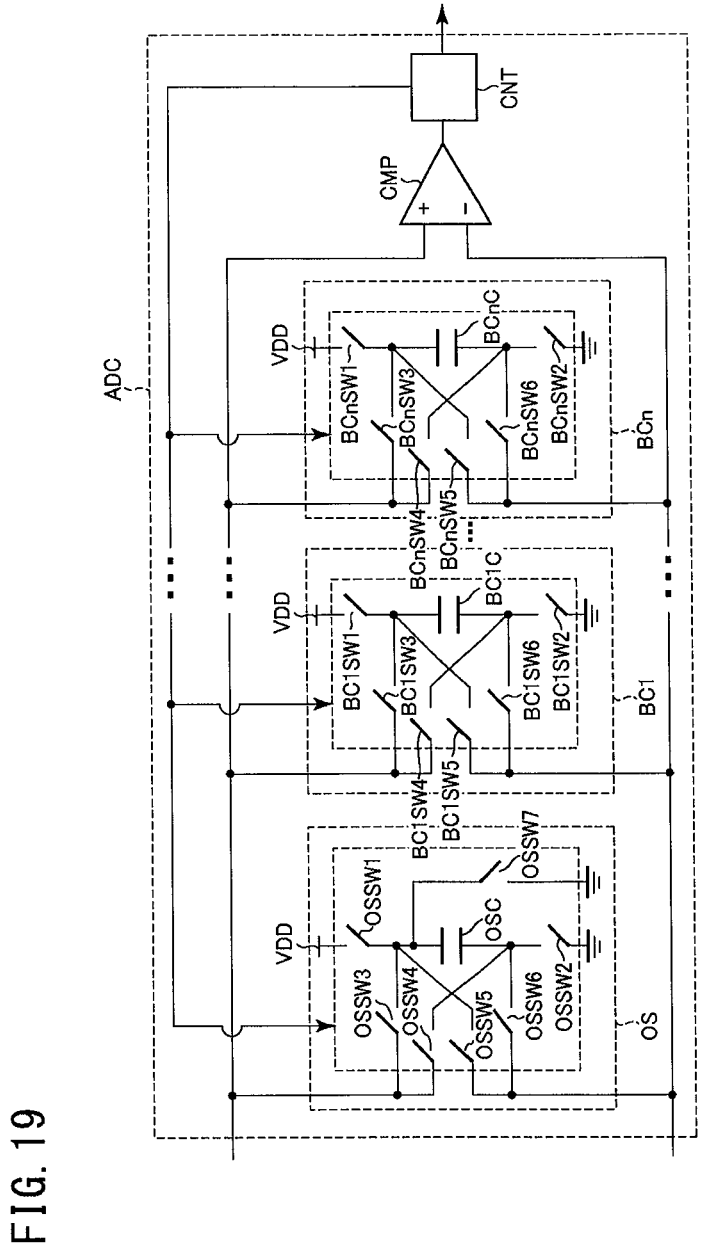
FIG. 19 is a diagram schematically showing the configuration of the analog-digital converting circuit section in a ninth embodiment.

FIG. 19 is a diagram schematically showing the configuration of the analog-digital converting circuit section ADC in a tenth embodiment. It should be noted that because the overall configuration of the analog-digital converter in the present embodiment is the same as that of the fourth embodiment shown in FIG. 9, further detailed description is omitted.

The components of the analog-digital converting circuit section ADC in the present embodiment shown in FIG. 19 will be described.

The analog-digital converting circuit section ADC in the present embodiment shown in FIG. 19 is obtained by applying the following changes to the analog-digital converting circuit section ADC in the fourth embodiment shown in FIG. 10. That is, the digital correcting DC shift application circuit section OS is added in parallel to the first to $n^{th}$ bit comparison circuit sections BC1 to BCn.

The components of the digital correcting DC shift application circuit section OS in the present embodiment shown in FIG. 19 will be described. The digital correcting DC shift application circuit section OS in the present embodiment shown in FIG. 19 contains a capacitance OSC, and a first to seventh switches OSSW1 to OSSW7.

The connection relation of the components of the digital correcting DC shift application circuit section OS in the present embodiment shown in FIG. 19 will be described. One of the ends of the first switch OSSW1 is connected with the power supply voltage VDD. One of the ends of the second switch OSSW2 is grounded. One of the ends of each of the third and fourth switches OSSW3 and OSSW4 is connected in common with the positive phase side input section of the analog-digital converting circuit section ADC. One of the ends of each of the fifth and sixth switches OSSW5 and OSSW6 is connected in common with the negative phase side input section of the analog-digital converting circuit section ADC. One of the ends of the seventh switch OSSW7 is grounded. The other end of each of the first, third, fifth and seventh switches OSSW1, OSSW3, OSSW5 and OSSW7 is connected in common with one of the ends of the capacitance OSC. The other end of each of the second, fourth and sixth switches OSSW2, OSSW4 and OSS6 is connected in common with the other end of the capacitance OSC.

Because the other configuration of the analog-digital converting circuit section ADC in the present embodiment shown in FIG. 19 is the same as that of the fourth embodiment shown in FIG. 10, further detailed description is omitted.

The digital correcting DC shift application circuit section OS in the present embodiment applies a digital correcting DC shift voltage in order to carry out the digital correction according to a method shown in Non-Patent Literature 3. In the analog-digital converting method in the present embodiment, at first, the same method as in the fourth embodiment is carried out until a passive amplification is made. the charge pre-charged in the capacitance OSC of the digital correcting DC shift application circuit section OS is shared by each capacitance contained in the voltage holding circuit section VH and used for the sampling operation, prior to bit determination operation from the MSB after the passive amplification completes. Thus, the digital correcting DC shift set in the form of the charge which is charged in the capacitance OSC can be effectively applied to the input signal.

A deviation in capacitance value of each of the capacitances which are contained in the analog-digital converting circuit section ADC can be digital-corrected by using a configuration in the present embodiment.

As a further development of the present embodiment, a system which is composed of two of the analog-digital converting circuit sections ADCs shown in FIG. 19 can be thought of.

Figure 20:
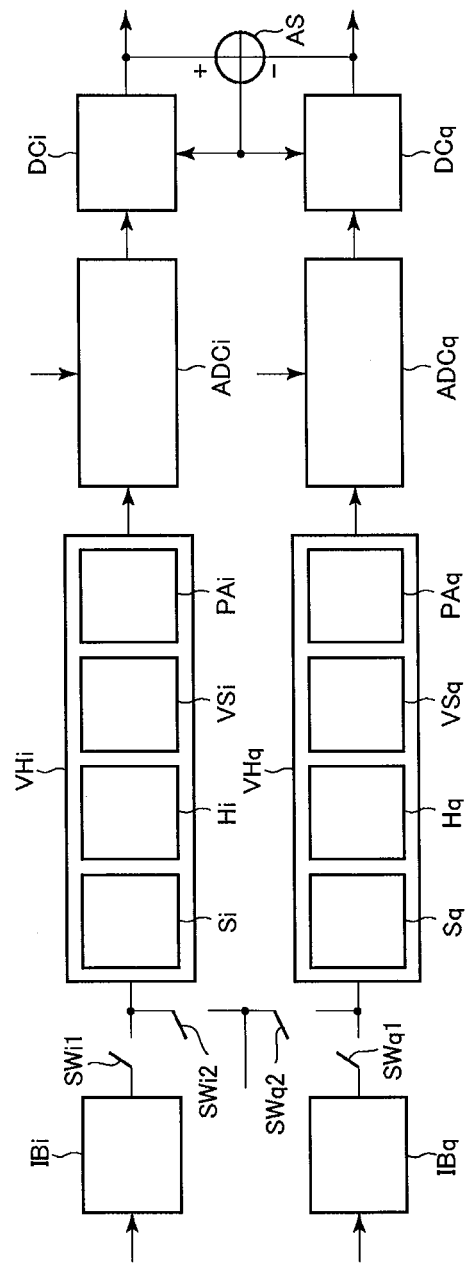
FIG. 20 is a functional block diagram showing the configuration of the analog-digital convertor in which the two analog-digital converting circuit sections are combined in a tenth embodiment.

FIG. 20 is a functional block diagram showing the configuration of the analog-digital converter in which the two analog-digital converting circuit sections ADCs in the tenth embodiment are combined. The components of the analog-digital converter shown in FIG. 20 will be described.

The analog-digital converter in the tenth embodiment shown in FIG. 20 contains an I-axis side input buffer circuit section IBi, a Q-axis side input buffer circuit section IBq, first and second I-axis side switches SWi1 and SWi2, Q-axis side first and second switches SWq1 and SWq2, an I-axis side voltage holding circuit section VHi, and a Q-axis side voltage holding circuit section VHq. The analog-digital converter in the tenth embodiment shown in FIG. 20 an I-axis side analog-digital converting circuit section ADCi, a Q-axis side analog-digital converting circuit section ADCq, an I-axis side digital correcting circuit section DCi, a Q-axis side digital correcting circuit section DCq, and an adder-subtractor AS.

Here, the I-axis side voltage holding circuit section VHi contains
an I-axis side sampling circuit Si, an I-axis side holding circuit Hi, an I-axis side in-phase voltage shift circuit section VSi, and I-axis side passive amplification circuit section PAi. In the same way, the Q-axis side voltage holding circuit section VHq contains a Q-axis side sampling circuit Sq, a Q-axis side holding circuit section Hq, a Q-axis side in-phase voltage shift circuit section VSq and a Q-axis side passive amplification circuit section PAq.

The connection relation of the components of the analog-digital converter in the tenth embodiment shown in FIG. 20 will be described. An I-axis side input section of the analog-digital converter section is connected with an input section of the I-axis side input buffer circuit section IBi. An output section of the I-axis side input buffer circuit section IBi is connected with one of the ends of the I-axis side first switch SWi1. The other end of the I-axis side first switch SWi1 is connected in common with one of the ends of the I-axis side second switch SWi2 and the input section of the I-axis side voltage holding circuit section VHi.

A Q-axis side input section of the analog-digital converter is connected with the input section of the Q-axis side input buffer circuit section IBq. An output section of the Q-axis side input buffer circuit section IBq is connected with one of the ends of the Q-axis side first switch SWq1. The other end of the Q-axis side first switch SWq1 is connected in common with one of the ends of the Q-axis side second switch SWq2 and the input section of the Q-axis side voltage holding circuit section VHq.

A correction signal input section of the analog-digital converter is connected in common with the other end of the I-axis side second switch SWi2 and the other end of the Q-axis side second switch SWq2.

An output section of the I-axis side voltage holding circuit section VHi is connected with the input section of the I-axis side analog-digital converting circuit section ADCi. An I-axis side digital correction offset voltage input section of the analog-digital converter is connected with an I-axis side digital correction offset voltage input section of the I-axis side analog-digital converting circuit section ADCi. An output section of the I-axis side analog-digital converting circuit section ADCi is connected with the first input section of the I-axis side digital correcting circuit section DCi.

An output section of the Q-axis side voltage holding circuit section VHq is connected with the input section of the Q-axis side analog-digital converting circuit section ADCq. The Q-axis side digital correction offset voltage input section of the analog-digital converter is connected with the Q-axis side digital correction offset voltage input section of the Q-axis side analog-digital converting circuit section ADCq. An output section of the Q-axis side analog-digital converting circuit section ADCq is connected with the first input section of the Q-axis side digital correcting circuit section DCq.

An output section of the I-axis side digital correcting circuit section DCi is connected in common with the I-axis side output section of the analog-digital converter and the adder-subtractor section AS of the positive input side. An output section of the Q-axis side digital correcting circuit section DCq is connected in common with the Q-axis side output section of the analog-digital converter and the negative input side of the adder-subtractor section AS. The output section of the adder-subtractor AS is connected in common with the second input section of the I-axis side digital correcting circuit section DCi and the second input section of the Q-axis side digital correcting circuit section DCq.

The operation of the analog-digital converter according to the present embodiment shown in FIG. 20 will be described. In the present embodiment, I/Q split digital correction is carried out by combining the two analog-digital converting circuit sections. In the I/Q split digital correction, the two analog-digital converting circuit sections input a common correction signal, and the analog-digital conversion is carried out. The adder-subtractor acquires a difference between the digital values outputted from the analog-digital converting circuit sections and the digital correction is carried out based on the difference. In this case, it is guaranteed that the correction efficient search algorithm converges in two digital correcting circuit sections by applying two digital correcting different DC shift voltages to the two analog-digital converting circuit sections.

Because the effect obtained in the analog-digital converter in the present embodiment is the same as that of the fourth embodiment, further detailed description is omitted.

Eleventh Embodiment

Figure 21:
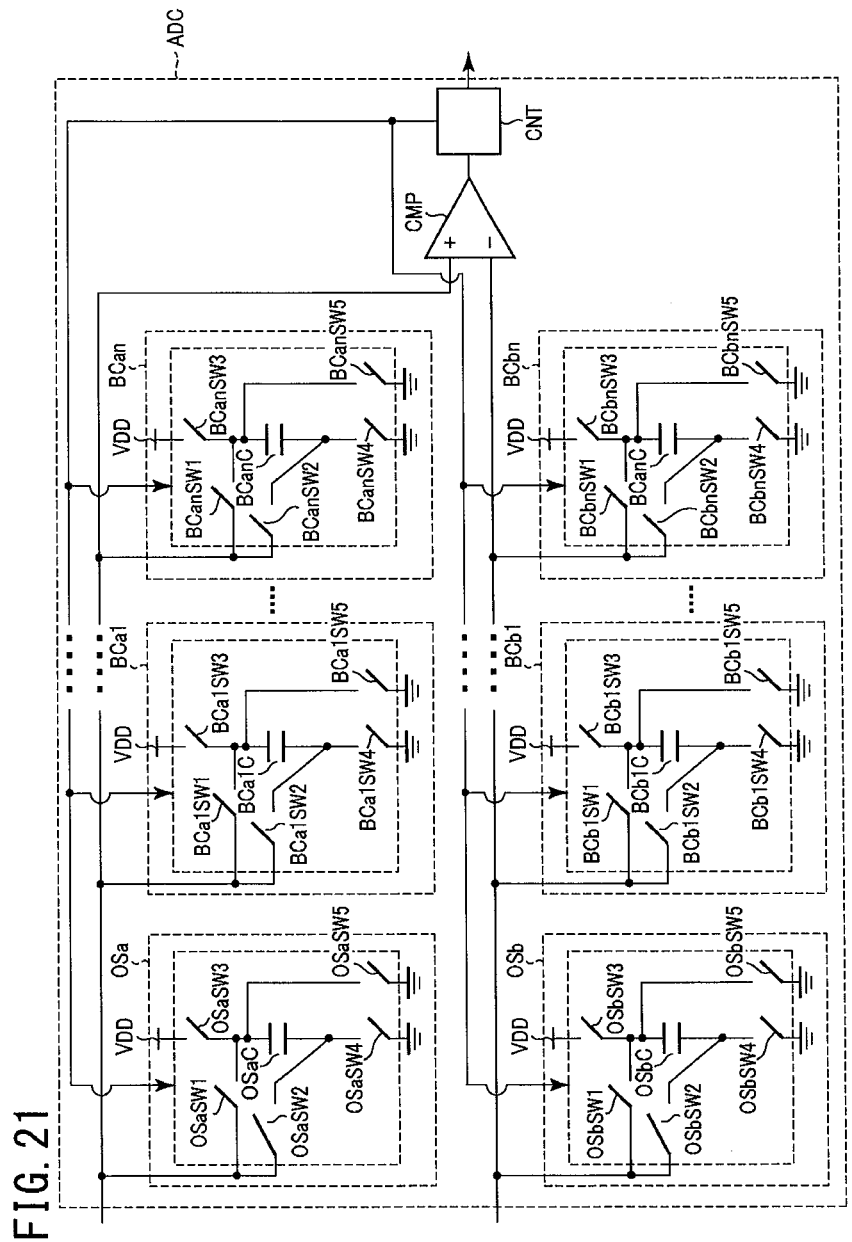
FIG. 21 is a diagram schematically showing the configuration of the analog-digital converting circuit section in an eleventh embodiment.

FIG. 21 is a diagram schematically showing the configuration of the analog-digital converting circuit section ADC in an eleventh embodiment. It should be noted that because the overall configuration of the analog-digital converter in the present embodiment is the same as that of the fourth embodiment shown in FIG. 9 or the seventh embodiment, further detailed description is omitted.

The analog-digital converting circuit section ADC in the present embodiment shown in FIG. 21 is obtained by applying the following changes to the analog-digital converting circuit section ADC in the seventh embodiment shown in FIG. 16. That is, a positive phase side digital correcting DC shift application circuit section OSa is added to be connected in parallel with the first to $n^{th}$ positive phase side bit comparison circuit sections BCa1 to BCan. A negative phase side digital correcting DC shift application circuit section OSb is added to be connected in parallel with the first to $n^{th}$ negative phase side bit comparison circuit sections BCb1 to BCbn.

The components of the positive phase side digital correcting DC shift application circuit section OSa shown in FIG. 21 will be described. The positive phase side digital correcting DC shift application circuit section OSa shown in FIG. 21 contains a positive phase side capacitance OSaC and first to fifth positive phase side switches OSaSW1 to OSaSW5.

The connection relation of the components of the positive phase side digital correcting DC shift application circuit section OSa shown in FIG. 21 will be described. The positive phase side input section of the analog-digital converting circuit section ADC is connected in common with one of the ends of each of the first and second positive phase side switches OSaSW1 and OSaSW2. One of the ends of the third positive phase side switch OSaSW3 is connected with the power supply voltage VDD. One of the ends of the fourth positive phase side switch OSaSW4 is grounded. One of the ends of the fifth positive phase side switch OSaSW5 is grounded. The other end of each of the first, third and fifth positive phase side switches OSaSW1, OSaSW3 and OSaSW5 is connected in common with one of the ends of the positive phase side capacitance OSaC. The other end of each of the second and fourth positive phase side switches OSaSW2 and OSaSW4 is connected in common with the other end of the positive phase side capacitance OSaC.

It should be noted that because the configuration of the negative phase side digital correcting DC shift application circuit section OSb shown in FIG. 21 is the same as that of the positive phase side digital correcting DC shift application circuit section OSa, further detailed description is omitted.

Because the other configuration of the analog-digital converting circuit section ADC according to the present embodiment shown in FIG. 21 is the same as that of the seventh embodiment shown in FIG. 16, further detailed description is omitted.

In this way, the analog-digital converting circuit section ADC in the present embodiment additionally contains the positive phase side digital correcting DC shift application circuit section OSa and the negative phase side digital correcting DC shift application circuit section OSb as a to-ground type capacitance digital analog converting circuit section to apply a digital correcting DC shift. Also, the capacitance digital-analog converting circuit section for successive approximation is of the to-ground type. The analog-digital converter in the present embodiment can carry out the digital correction in a method shown in Non-Patent Literature 3.

In the present embodiment, the DC shift application capacitance digital-analog converting circuit section for the digital correction and the successive approximation capacitance digital analog converting circuit section are of the to-ground type, but one of them may be of the to-ground type and the other may be a floating type.

Because the operation of the analog-digital converter in the present embodiment and the resultant effect are the same as those of the tenth embodiment, further detailed description is omitted.

Twelfth Embodiment

Figure 22:
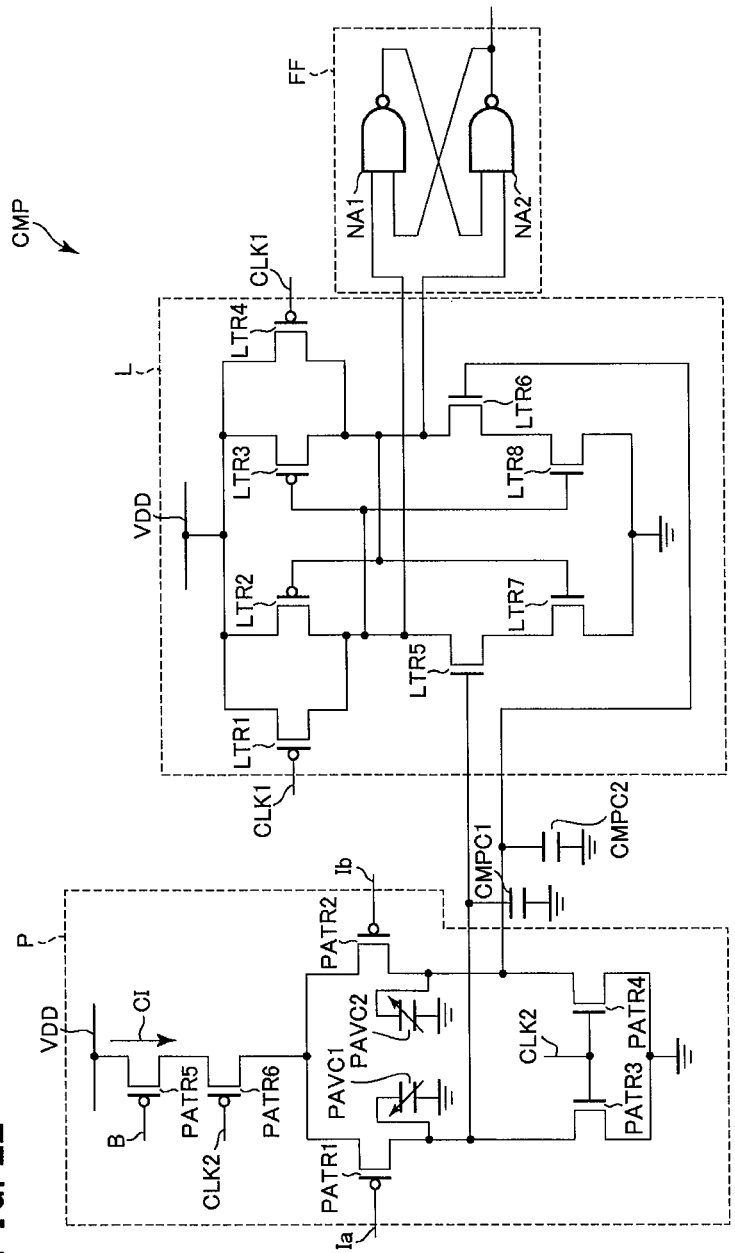
FIG. 22 is a diagram schematically showing the configuration of a comparator in a twelfth embodiment.

FIG. 22 is a diagram schematically showing the configuration of a comparator CMP in a twelfth embodiment. It should be noted that because the configuration of the analog-digital converting circuit section ADC in the present embodiment is the same as that of the seventh embodiment shown in FIG. 16, further detailed description is omitted. Also, because the configuration of the analog-digital converter in the present embodiment is that same as that of the fourth or seventh embodiment shown in FIG. 9, further detailed description is omitted.

The components of the comparator CMP in the twelfth embodiment shown in FIG. 22 will be described. The comparator CMP shown in FIG. 22 contains a preamplifier circuit section P, first and second capacitances CMPC1 and CMPC2, a latch circuit section L, a flip-flop circuit section FF, a bias input section B, first and second clock signal input sections CLK1 and CLK2, a positive phase side input section Ia, a negative phase side input section Ib, and an output section.

The preamplifier circuit section P contains first to sixth transistors PATR1 to PATR6, and first and second variable capacitances PAVC1 and PAVC2. The latch circuit section L contains first to eighth transistors LTR1 to LTR8. The flip-flop circuit section FF contains first and second NAND circuits NA1 and NA2.

The connection relation of the components of the comparator CMP in the twelfth embodiment shown in FIG. 22 will be described.

The first, the connection relation of the components of the preamplifier circuit section P will be described. The source of the fifth transistor PATR5 is connected with the power supply voltage VDD. The gate of the fifth transistor PATR5 is connected with the bias input section B. The drain of the fifth transistor PATR5 is connected with the source of the sixth transistor PATR6. The gate of the sixth transistor PATR6 is connected with the second clock signal input section CLK2. The drain of the sixth transistor PATR6 is connected in common with the source of each of the first and second transistors PATR1 and PATR2. The gate of the first transistor PATR1 is connected with the positive phase side input section Ia. The gate of the second transistor PATR2 is connected with the negative phase side input section Ib. The drain of the first transistor PATR1 is connected in common with the drain of the third transistor PATR3, one of the ends of the first variable capacitance PAVC1, one of the ends of the first capacitance CMPC1, and the gate of the fifth transistor LTR5 which is contained in the latch circuit section L. The drain of the second transistor PATR2 is connected in common with the drain of the fourth transistor PATR4, one of the ends of the second variable capacitance PAVC2, one of the ends of the second capacitance CMPC2, and the gate of the sixth transistor LTR6 which is contained in the latch circuit section L. The gate of each of the third and fourth transistors PATR3 and PATR4 is connected in common with the second clock signal input section CLK2. The source of each of the third and fourth transistors PATR3 and PATR4 is grounded.

It should be noted that a PMOS input-type preamplifier configuration is employed in this example, but it may be of an NMOS input type.

Next, the connection relation of the components of the latch circuit section L will be described. The source of each of the first to fourth transistors LTR1 to LTR4 is connected in common with the power supply voltage VDD. The gate of each of the first and fourth transistors LTR1 and LTR4 is connected with the first clock signal input section CLK1. The drain of the first transistor LTR1 is connected in common with the drain of the second transistor LTR2, the gate of the third transistor LTR3, the drain of the fifth transistor LTR5, the gate of the eighth transistor LTR8, and one of input sections of a first NAND circuit NA1 which is contained in the flip-flop circuit section FF. The drain of the fourth transistor LTR4 is connected in common with the gate of the second transistor LTR2, the drain of the third transistor LTR3, the drain of the sixth transistor LTR6, the gate of the seventh transistor LTR7, and one of the input sections of the second NAND circuit NA2 which is contained in the flip-flop circuit section FF. The source of the fifth transistor LTR5 is connected with the drain of the seventh transistor LTR7. The source of the sixth transistor LTR6 is connected with the drain of the eighth transistor LTR8. The source of each of the seventh and eighth transistors LTR7 and LTR8 is grounded.

Next, the connection relation of the components of the flip-flop circuit section FF will be described. The output section of the first NAND circuit NA1 is connected with the other input section of the second NAND circuit NA2. The output section of the second NAND circuit NA2 is connected in common with the other input section of the first NAND circuit NA1 and the output section of the comparator CMP.

The operation of the comparator CMP in the present embodiment will be described. For example, the preamplifier circuit section P has a function to adjust a DC offset voltage to zero by using the variable capacitance, and also has a constant current source.

Generally, a preamplifier circuit section is needed to avoid that the latch circuit section connected at the rear stage falls into a meta-stable state and to ease the influence of noise by the latch circuit section. There are an amplification period and a reset period in the preamplifier circuit section. The preamplifier circuit section in the amplification period operates as an amplifier by a constant bias current which flows through a MOS transistor differential pair. The preamplifier circuit section in the reset period can attain the power saving through blocking-off of the bias current. For example, it is desirable that zero adjustment of the DC offset voltage goes is previously carried out by using a period of non-operation of the analog-digital converting circuit section ADC.

Because the bias current is constant when the preamplifier circuit section P in the present embodiment operates as the amplifier, the DC offset voltage of the comparator CMP does not change even if the input in-phase voltage of the comparator CMP changes with the progress of a conversion step like the seventh embodiment. Therefore, if the DC offset voltage of the comparator CMP has been previously adjusted once to be zero under a suitable input in-phase voltage, the DC offset voltage of the comparator CMP is maintained as zero during the analog-digital change operation. Thus, the analog-digital converter of the present embodiment can realize a precision conversion.

It should be noted that the most essential effect of the analog-digital converter in the present embodiment is in the point that the precision of the analog-digital conversion becomes twice through passive amplification, like the other embodiments.

Thirteenth Embodiment

Figure 23:
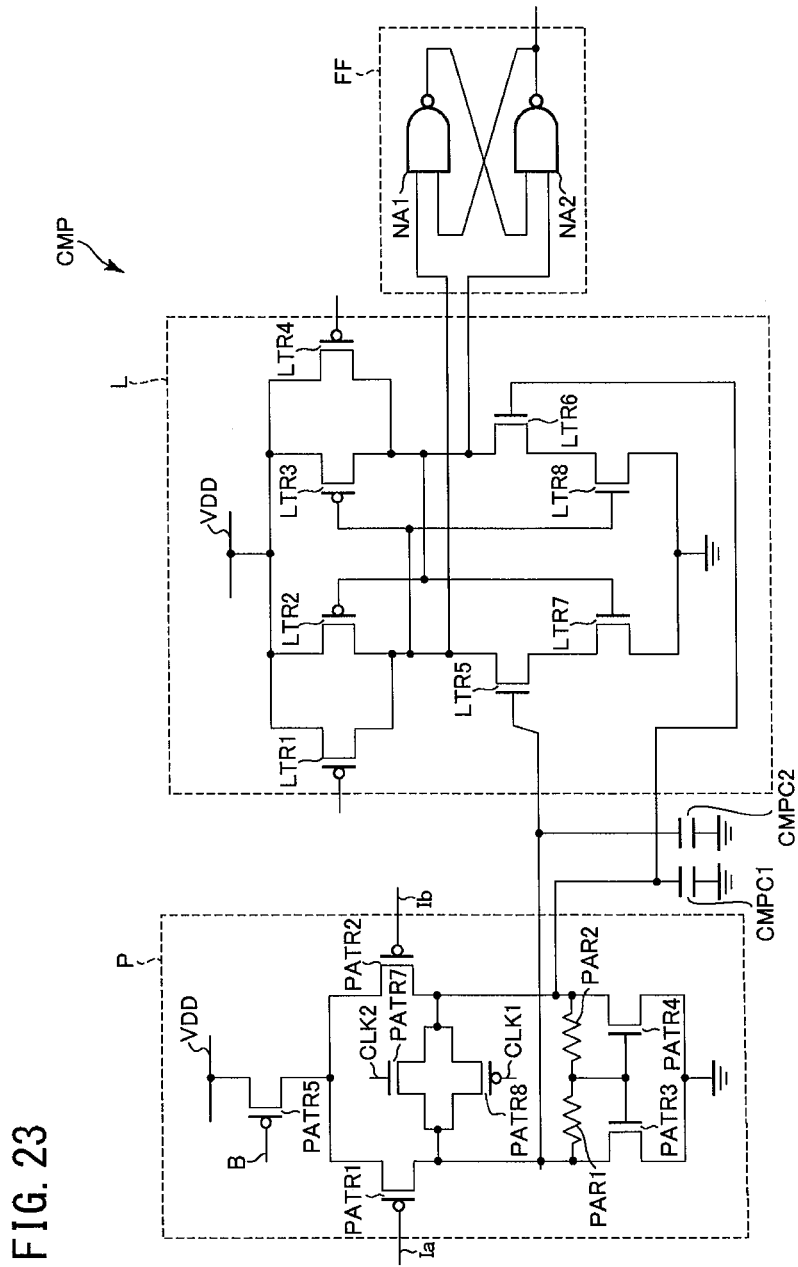
FIG. 23 is a diagram schematically showing the configuration of the comparator in a thirteenth embodiment.

FIG. 23 is a diagram schematically showing the configuration of the comparator CMP in a thirteenth embodiment. It should be noted that because the configuration of the analog-digital converting circuit section ADC is the same as that of the seventh embodiment shown in FIG. 16, further detailed description is omitted. Also, because the configuration of the analog-digital converter in the present embodiment is the same as that of the fourth or seventh embodiment shown in FIG. 9, further detailed description is omitted.

The comparator CMP in the thirteenth embodiment shown in FIG. 23 is obtained by changing the preamplifier circuit section P of the comparator CMP in the twelfth embodiment shown in FIG. 22.

The components of the preamplifier circuit section P in the thirteenth embodiment shown in FIG. 23 will be described. The preamplifier circuit section P in the thirteenth embodiment shown in FIG. 23 contains the first to fifth, seventh and eighth transistors PATR1 to PATR5, PATR7, PATR8 and first and second resistances PAR1 and PAR2.

The connection relation of the components of the preamplifier circuit section P in the thirteenth embodiment shown in FIG. 23 will be described. The source of the fifth transistor PATR5 is connected with the power supply voltage VDD. The gate of the fifth transistor PATR5 is connected with a bias input section B. The drain of the fifth transistor PATR5 is connected in common with the source of each of the first and second transistors PATR1 and PATR2. The gate of the first transistor PATR1 is connected with the positive phase side input section Ia. The gate of the second transistor PATR2 is connected with the negative phase side input section Ib. The drain of the first transistor PATR1 is connected in common with the drain of each of the seventh and eighth transistors PATR7 and PATR8, the drain of the third transistor PATR3, one of the ends of the resistance PAR1 of, and the first, one of the ends of the first capacitance CMPC1 and the gate of the fifth transistor LTR5 of the latch circuit section L. The drain of the second transistor PATR2 is connected in common with one of the ends of the resistance PAR2 of the source of each of the seventh and eighth transistors PATR7 and PATR8, the drain of the fourth transistor PATR4 and the second, one of the ends of the second resistance PASR2, one of the ends of the capacitance CMPC2, and the gate of the sixth transistor LTR6 of the latch circuit section L. The gate of the seventh transistor PATR7 is connected with the second clock signal input section CLK2. The gate of the eighth transistor PATR8 is connected with the first clock signal input section CLK1. The other end of each of the first and second resistances PAR1 and PAR2 is connected in common with the gate of one of the third and fourth transistors PATR3 and PATR4. The source of each of the third and fourth transistors PATR3 and PATR4 is grounded.

Because the other configuration of the comparator CMP in the present embodiment shown in FIG. 23 is the same as that of the twelfth embodiment shown in FIG. 22, further detailed description is omitted.

The operation of the comparator CMP in the present embodiment will be described. The comparator CMP is the same as the comparator CMP in the twelfth embodiment shown in FIG. 22 in the point of the maintenance of the zero DC offset voltage in the constant current source type. However, the comparator CMP in the present embodiment is different from that of the twelfth embodiment, is always in an amplifier operation mode to continue to flow the constant bias current.

Because the other operation of the comparator CMP in the present embodiment is the same as that of the general comparator, further detailed description is omitted. Also, because the effect which is obtained by the comparator in the present embodiment and the analog-digital converter in the present embodiment using this comparator is the same as that of the twelfth embodiment, further detailed description is omitted.

Fourteenth Embodiment

Figure 24:
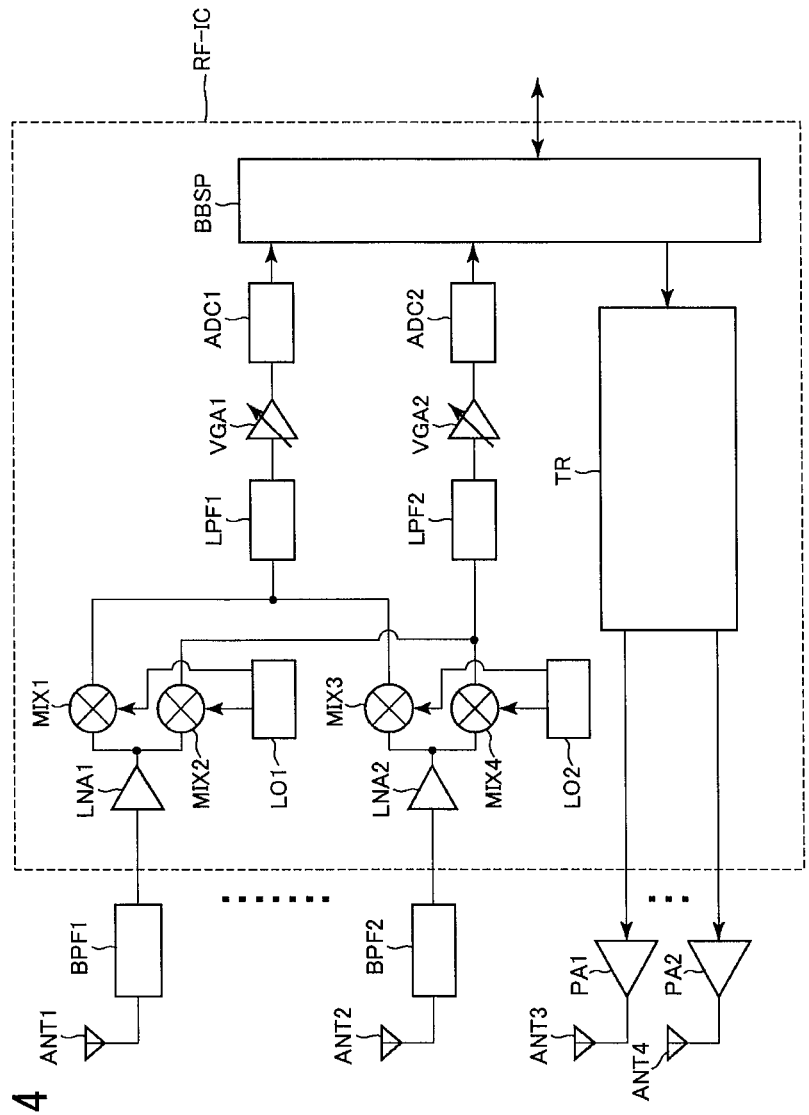
FIG. 24 is a diagram schematically showing the configuration of an RF-IC for a mobile terminal in a fourteenth embodiment and the components of a peripheral circuit.

FIG. 24 is a diagram schematically showing the configuration of RF-IC for a mobile terminal in a fourteenth embodiment and the components of peripheral circuit.

The components of the RF-IC for the mobile terminal and the peripheral circuit shown in FIG. 24 will be described. The RF-IC for the mobile terminal shown in FIG. 24 contains first and second low noise amplifiers LNA1 and LNA2, first to fourth mixers MIX1 to MIX4, first and second local oscillation circuit sections LO1 and LO2, and first and second low pass filters LPF1 and LPF2. Moreover, the RF-IC for the mobile terminal shown in FIG. 24 contains first and second variable gain amplifiers VGA1 and VGA2, first and second analog-digital converters ADC1 and ADC2, a baseband signal processing circuit section BBSP and a transmission circuit section TR.

The peripheral circuit components of the RF-IC for the mobile terminal shown in FIG. 24 contains first to fourth antennas ANT1 to ANT4, first and second band pass filters BPF1 and BPF2 and first and second power amplifiers PA1 and PA2.

The connection relation of the components shown in FIG. 24 will be described. The first antenna ANT1 is connected with the input section of the first low noise amplifier LNA1 through the first band pass filter BPF1. The second antenna ANT2 is connected with the input section of the second low noise amplifier LNA2 through the second band pass filter BPF2. The output section of the first low noise amplifier LNA1 is connected in common with one of the input sections of each of the first and second mixers MIX1 and MIX2. The output section of the second low noise amplifier LNA2 is connected in common with one of the input sections of each of the third and fourth mixers MIX3 and MIX4.

One of the output sections of the first local oscillation circuit section LO1 is connected with the other input section of the first mixer MIX1. The other output section of the first local oscillation circuit section LO1 is connected with the other input section of the second mixer MIX2. One of the output sections of the second local oscillation circuit section LO2 is connected with the other input section of the third mixer MIX3. The other output section of the second local oscillation circuit section LO2 is connected with the other input section of the fourth mixer MIX4.

The output section of each of the first and third mixers MIX1 and MIX3 is connected in common with the input section of the first low pass filter LPF1. The output section of each of the second and fourth mixers MIX2 and MIX4 is connected in common with the input section of the second low pass filter LPF2. The output section of the first low pass filter LPF1 is connected with one of the input sections of the baseband signal processing circuit section BBSP through the first variable gain amplifier VGA1 and the first analog-digital converter ADC1 in this order. The path from the first low pass filter LPF1 to the first analog-digital converter ADC1 is used as the I-axis side path. The output section of the second low pass filter LPF2 is connected with the other input section of the baseband signal processing circuit section BBSP through the second variable gain amplifier VGA2 and the second analog-digital converter ADC2 in this order. The path from the second low pass filter LPF2 to the second analog-digital converter ADC2 is used as the Q-axis side route.

The output section of the baseband signal processing circuit section BBSP is connected with the input section of the transmission circuit section TR. One of the output sections of the transmission circuit section TR is connected with the third antenna ANT3 through the first power amplifier PA1. The other output section of the transmission circuit section TR is connected with the fourth antenna ANT4 through the second power amplifier PA2. It should be noted that the baseband signal processing circuit section BBSP is connected with another circuit (not shown) at the other input/output section.

The operation of the RF-IC for the mobile terminal in the present embodiment will be described. Two of the analog-digital converters according to any of the third to thirteenth embodiments are used as the first and second analog-digital converters ADC1 and ADC2 shown in FIG. 24. Especially, the digital correction in the tenth embodiment shown in FIG. 20 may be carried out.

For example, the circuit according to the first and third antennas ANT1 and ANT3 may carry out the communication of GSM and so on to have a priority in a high signal resolution, and the circuit according to the second and fourth antennas ANT2 and ANT4 may carry out the communication of LTE and so on, to have a priority in a high speed signal communication. The RF-IC for the mobile terminal in the present embodiment may be of a multi-standard type corresponding to the communication mode of WCDMA, LTE Advanced and so on. In this case, antennas and circuits may be further added for every different communication mode.

Because the effective resolution of 11 bits or more is obtained through the passive amplification in the analog-digital converters ADC1 and ADC2 in the present embodiment, an analog signal can be processed in all the communication modes in common. That is, as mentioned above, it is enough to provide two analog-digital converters ADC1 and ADC2 for the I-axis side path and the Q-axis side path, respectively. Thus, the chip area of the RF-IC for the mobile terminal in the present embodiment can be reduced. The reduction of the chip area is one of the most important requests in the RF-IC for the mobile terminal.

As such, the embodiments of the present invention have been described. However, the present invention is not limited to the embodiments and various modifications are possible in a range not departing away from the spirit of the present invention. Also, the features described in the embodiments may be freely combined in a range of no technical contradiction.

What is claimed is:

1. A passive amplification circuit comprising:
 a first input terminal configured to input a positive signal of a differential signal;
 a second input terminal configured to input a negative signal of the differential signal;
 first to fourth capacitances charged with voltages of the differential signal in a sampling operation;
 a plurality of switches configured to switch a connection relation of the first to fourth capacitances between a first state of the sampling operation and a second state of an amplification operation; and
 a first output terminal configured to output a positive output signal of the differential signal amplified in the amplification operation,
 a second output terminal configured to output a negative output signal of the differential signal amplified in the amplification operation,
 wherein in the first state, the first capacitance and the second capacitance are connected in parallel and the third capacitance and the fourth capacitance are connected in parallel,
 wherein in the second state, the first capacitance and the second capacitance are connected in series and the third capacitance and the fourth capacitance are connected in series,
 wherein each of one end and the other end of each of the first to fourth capacitances is connected with any one of the plurality of switches, the first and the second output terminals, a power supply voltage and a ground voltage,
 wherein one end and the other end of each of the plurality of switches is connected with any one of the first to fourth capacitances, the first and the second input terminals, the first and the second output terminals, the power supply voltage and the ground voltage;
 wherein in the first state, the first to fourth capacitances are connected in parallel between the first input terminal and the second input terminal,
 wherein in the second state, the first capacitance is connected between the power supply voltage and the second output terminal,
 wherein in the second state, the second capacitance is connected between the second output terminal and the ground voltage,
 wherein in the second state, the third capacitance is connected between the power supply voltage and the first output terminal,
 wherein in the second state, the fourth capacitance is connected between the first output terminal and the ground voltage, and
 wherein the first capacitance and the third capacitance have an identical first capacitance value, and the second capacitance of the fourth capacitance have an identical second capacitance value.

2. The passive amplification circuit according to claim 1, wherein the plurality of switches comprises:
 a first switch group set to a conductive state in the first state and a block-off state in the second state; and
 a second switch group set to the block-off state in the first state and the conductive state in the second state,
 wherein the one end of each of switches of the first switch group is connected with any of the input terminals of the input terminal group and the other end thereof is connected with any of the first to fourth capacitances, and
 wherein the one end of each of switches of the second switch group is connected with the power supply voltage or the ground voltage, and the other end thereof is connected with any of the first to fourth capacitances.

3. An analog-digital converter comprising:
 an analog-digital converting circuit configured to convert an analog value into a digital value;
 a holding circuit provided at a front-stage of the analog-digital converting circuit to hold the analog value; and
 a control circuit configured to control the analog-digital converting circuit and the holding circuit,
 wherein the holding circuit comprises:
 a first capacitance;
 a second capacitance connected in parallel with the first capacitance through in a first state, and connected in series with the first capacitance in a second state,
 a first switch configured to connect one end of the first capacitance to an input section of the holding circuit in a first state and to isolate the one end of the first capacitance from the input section in a second state;
 a second switch configured to connect one end of the second capacitance and the input section in the first state and to isolate the one end of the second capacitance from the input section in the second state;
 a third switch configured to isolate the one end of the first capacitance from the other end of the second capacitance in the first state and to connect the one end of the first capacitance with the other end of the second capacitance in the second state;
 a fourth switch configured to ground the other end of the second capacitance in the first state and isolate the other end of the second capacitance from the ground voltage in the second state; and
 a fifth switch configured to isolate the one end of the second capacitance from the analog-digital converting circuit in the first state and to connect the one end of the second capacitance with the analog-digital converting circuit in the second state, and
 wherein the other end of the first capacitance is grounded.

4. The analog-digital converter according to claim 3, further comprising:
 an in-phase voltage shift circuit configured to carry out a DC level shift to the voltage so as to fall within a predetermined range after the passive amplification.

5. The analog-digital converter according to claim 4, wherein
 the second capacitance is connected in parallel with the first capacitance in the first state, isolated from the first capacitance in the second state and connected in series with the first capacitance in a third state;

wherein the holding circuit further comprises:
a third capacitance connected in series with the first capacitance in the first state and the second state, connected in parallel with the first capacitance in the third state; and
a fourth capacitance connected in series with the second capacitance in the first state and the second state, and connected in parallel with the second capacitance in the third state.

6. The analog-digital converter according to claim 5, wherein the holding circuit comprises:
a first switch configured to connect one end of each of the first capacitance and the third capacitance with an input section of the holding circuit in the first state, and to isolate the one end of each of the first capacitance and the third capacitance from the input section in the second state and the third state;
a second switch configured to connect one end of each of the second capacitance and the fourth capacitance with the input section in the first state, and to isolate the one end of each of the second capacitance and the fourth capacitance from the input section in the second state and the third state;
a third switch configured to isolate the one end of the first capacitance from the other end of the second capacitance in the first state and the second state, and to connect the one end of the first capacitance and the other end of the second capacitance in the third state;
a fourth switch configured to connect the other end of the second capacitance and a ground voltage in the first state and the second state, and to isolate the other end of the second capacitance from the ground voltage;
a fifth switch configured to isolate the one end of each of the second capacitance and the fourth capacitance from the output section of the holding circuit in the first state and the second state, and to connect the one end of each of the second capacitance and the fourth capacitance with the output section of the holding circuit in the third state;
a sixth switch configured to isolate the other end of each of the first capacitance and the third capacitance from the other end of the fourth capacitance in the first state and the second state, and to connect the other end of each of the first capacitance and the third capacitance with the other end of the fourth capacitance in the third state;
a seventh switch configured to connect the other end of the fourth capacitance with the power supply voltage in the first state and to isolate the other end of the fourth capacitance from the power supply voltage in the second state and the third state; and
an eighth switch configured to isolate the other end of the fourth capacitance from the ground voltage in the first state and the third state and connect the other end of the fourth capacitance with the ground voltage in the second state,
wherein the other end of the first capacitance is grounded, and
wherein the holding circuit further comprises an inverter having an output section connected with the other end of the third capacitance, and configured to input a signal of a low state in the first state and of a high state in the second state and the third state.

7. The analog-digital converter according to claim 3, wherein the analog-digital converting circuit comprises:
a plurality of to-ground connection type bit comparison circuits provided for a plurality of bits of the digital value, respectively; and
a comparator configured to compare differential voltages generated by carrying out charge share by at least one of the plurality of to-ground connection type bit comparison circuits and the holding circuit.

8. The analog-digital converter according to claim 7, wherein each of the plurality of to-ground connection type bit comparison circuits comprises:
a capacitance;
a first switch configured to connect or isolate one end of the capacitance with or from an input section of the analog-digital converting circuit;
a second switch configured to connect or isolate the other end of the capacitance with or from the input section of the analog-digital converting circuit;
a third switch configured to connect or isolate the one end of the capacitance with or from the power supply voltage;
a fourth switch configured to connect or isolate the other end of the capacitance with or from the ground voltage; and
a fifth switch configured to connect or isolate the one end of the capacitance with or from the ground voltage.

9. The analog-digital converter according to claim 7, wherein the analog-digital converting circuit further comprises:
a digital correcting DC shift application circuit configured to apply a DC shift necessary to search a correction efficient for correcting the digital value.

10. The analog-digital converter according to claim 9, wherein the digital correcting DC shift application circuit comprises:
a capacitance;
a first switch configured to connect or isolate one end of said capacitance with or from an input section of the analog-digital converting circuit;
a second switch configured to connect or isolate the other end of the capacitance with or from the input section of the analog-digital converting circuit;
a third switch configured to connect or isolate the one end of the capacitance with or from the power supply voltage;
a fourth switch configured to connect or isolate the other end of the capacitance with or from the ground voltage; and
a fifth switch configured to connect or isolate the one end of the capacitance with or from the ground voltage.

11. The analog-digital converter according to claim 7, wherein the comparator comprises:
a preamplifier circuit configured to adjust a DC offset voltage to zero; and
a latch circuit provided for a rear stage of the preamplifier circuit.

12. The analog-digital converter according to claim 11, wherein the preamplifier circuit further comprises:
a clock signal input section configured to input a clock signal to switch an amplification period and a reset period.

* * * * *